(12) United States Patent
Corwin et al.

(10) Patent No.: US 9,614,139 B2
(45) Date of Patent: Apr. 4, 2017

(54) FLEXIBLE LIGHTING DEVICE HAVING UNOBTRUSIVE CONDUCTIVE LAYERS

(71) Applicant: Grote Industries, LLC, Madison, IN (US)

(72) Inventors: William L. Corwin, Madison, IN (US); Donald Lee Gramlich, Jr., Deputy, IN (US); Scott J. Jones, Woodbury, MN (US); Martin J. Marx, Henderson, NV (US); Cesar Perez-Bolivar, Madison, IN (US); George M. Richardson, II, Charlestown, IN (US); James E. Roberts, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 0 days.

(21) Appl. No.: 15/041,158

(22) Filed: Feb. 11, 2016

(65) Prior Publication Data

US 2016/0172561 A1    Jun. 16, 2016

Related U.S. Application Data

(62) Division of application No. 13/948,443, filed on Jul. 23, 2013, now Pat. No. 9,299,899.

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2224/16* (2013.01); *H01L 2933/0066* (2013.01)

(58) Field of Classification Search
CPC . H01L 33/62; H01L 25/0753; H01L 2224/16; H01L 2933/0066
See application file for complete search history.

(56) References Cited

U.S. PATENT DOCUMENTS 6,455,878 B1   9/2002   Bhat et al.
6,498,355 B1   12/2002  Harrah et al.
(Continued)

FOREIGN PATENT DOCUMENTS

EP    2980871 A1    2/2016

OTHER PUBLICATIONS

Extended European Search Report issued by the European Patent Office on Jan. 7, 2015 in corresponding European Patent Application No. 14178055.1.

(Continued)

*Primary Examiner* — Mary Wilczewski
(74) *Attorney, Agent, or Firm* — Posz Law Group, PLC

(57) ABSTRACT

A flexible lighting element is provided, comprising: a first substrate; first and second conductive elements over the first substrate; a light-emitting element having first and second contacts that are both on a first surface of the light-emitting element, the first and second contacts being electrically connected to the first and second conductive elements, respectively, and the light-emitting element emitting light from a second surface opposite the first surface; a transparent layer located adjacent to the second surface; and a transparent affixing layer located between the first substrate and the transparent layer, wherein the transparent layer and the transparent affixing layer are both sufficiently transparent to visible light that they will not decrease light transmittance below 70%, and the first and second conductive layers are at least partially transparent to visible light, or are 300 μm or smaller in width, or are concealed by a design feature from a viewing direction.

5 Claims, 11 Drawing Sheets

(56) References Cited

U.S. PATENT DOCUMENTS

| | | |
|---|---|---|
| 6,972,438 B2 | 12/2005 | Li et al. |
| 7,745,832 B2 | 6/2010 | Hsieh et al. |
| 7,842,960 B2 | 11/2010 | Reginelli et al. |
| 7,952,107 B2 | 5/2011 | Daniels et al. |
| 8,367,436 B2 | 2/2013 | Kwack et al. |
| 8,471,287 B2 | 6/2013 | Hu et al. |
| 8,482,212 B1 | 7/2013 | Ivey et al. |
| 8,710,662 B2 | 4/2014 | Umakoshi et al. |
| 8,785,220 B2 | 7/2014 | Schwab et al. |
| 8,963,195 B2 | 2/2015 | Brooks et al. |
| 9,136,441 B2 | 9/2015 | Brooks et al. |
| 2002/0060526 A1 | 5/2002 | Timmermans et al. |
| 2002/0068373 A1 | 6/2002 | Lo et al. |
| 2003/0141563 A1 | 7/2003 | Wang |
| 2004/0000867 A1 | 1/2004 | Chen |
| 2004/0070001 A1 | 4/2004 | Lee et al. |
| 2004/0217383 A1 | 11/2004 | Krames et al. |
| 2004/0256630 A1 | 12/2004 | Cao |
| 2006/0208364 A1 | 9/2006 | Wang et al. |
| 2007/0105250 A1 | 5/2007 | Daniels et al. |
| 2009/0114928 A1 | 5/2009 | Messere et al. |
| 2009/0242923 A1 | 10/2009 | Goodrich |
| 2010/0248400 A1 | 9/2010 | Kim |
| 2010/0317132 A1 | 12/2010 | Rogers et al. |
| 2011/0195532 A1 | 8/2011 | Lerman et al. |
| 2011/0284885 A1 | 11/2011 | Hong |
| 2011/0315956 A1 | 12/2011 | Tischler et al. |
| 2011/0316031 A1 | 12/2011 | Ooyabu et al. |
| 2012/0007107 A1 | 1/2012 | Choi |
| 2012/0038047 A1 | 2/2012 | Do et al. |
| 2012/0153338 A1 | 6/2012 | Guo et al. |
| 2012/0193648 A1 | 8/2012 | Donofrio et al. |
| 2012/0193661 A1 | 8/2012 | Emerson et al. |
| 2012/0205697 A1 | 8/2012 | Kim et al. |
| 2012/0256187 A1 | 10/2012 | Yu et al. |
| 2014/0151742 A1 | 6/2014 | Logunov et al. |
| 2014/0159061 A1 | 6/2014 | Tomoda et al. |
| 2014/0183591 A1 | 7/2014 | Jow et al. |
| 2014/0226345 A1 | 8/2014 | Song et al. |
| 2014/0264401 A1 | 9/2014 | Brooks et al. |
| 2014/0264423 A1 | 9/2014 | Brooks et al. |
| 2014/0264424 A1 | 9/2014 | Brooks et al. |
| 2015/0028377 A1 | 1/2015 | Jones et al. |
| 2015/0060905 A1 | 3/2015 | Nam et al. |
| 2015/0060911 A1 | 3/2015 | Chien et al. |

OTHER PUBLICATIONS

Communication Pursuant to Article 94(3) EPC issued by the European Patent Office on Jun. 16, 2016 in the corresponding European Patent Application No. 14 178 055.1 in connection with related U.S. Appl. No. 13/948,443.

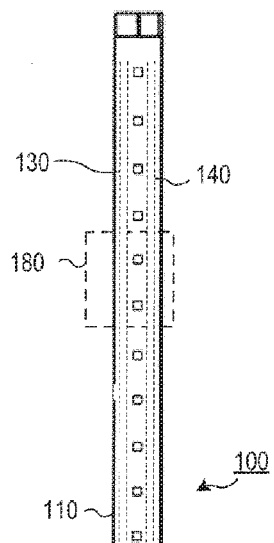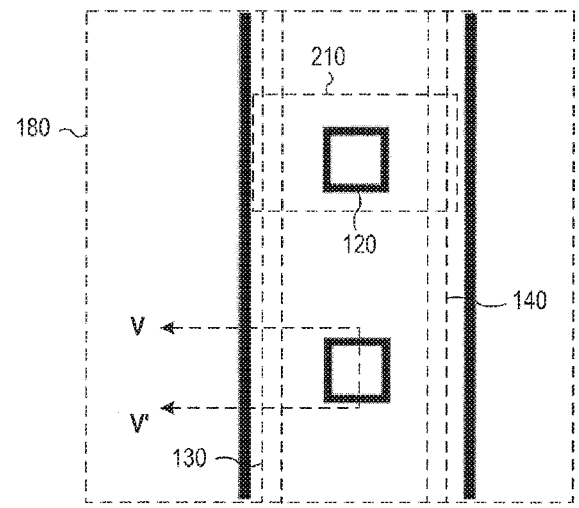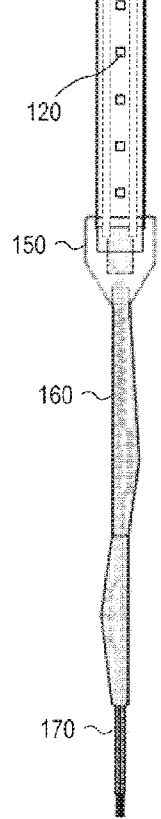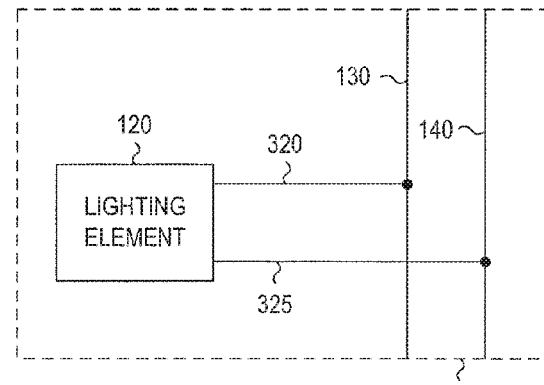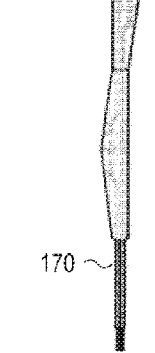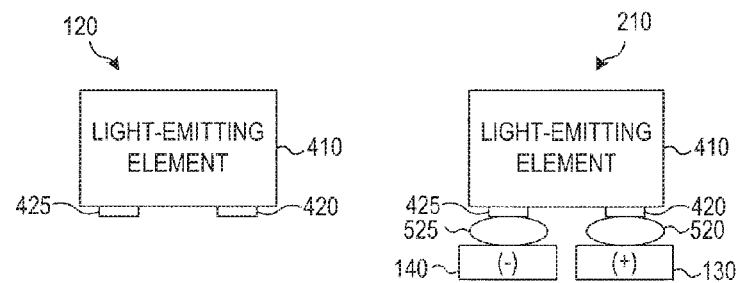

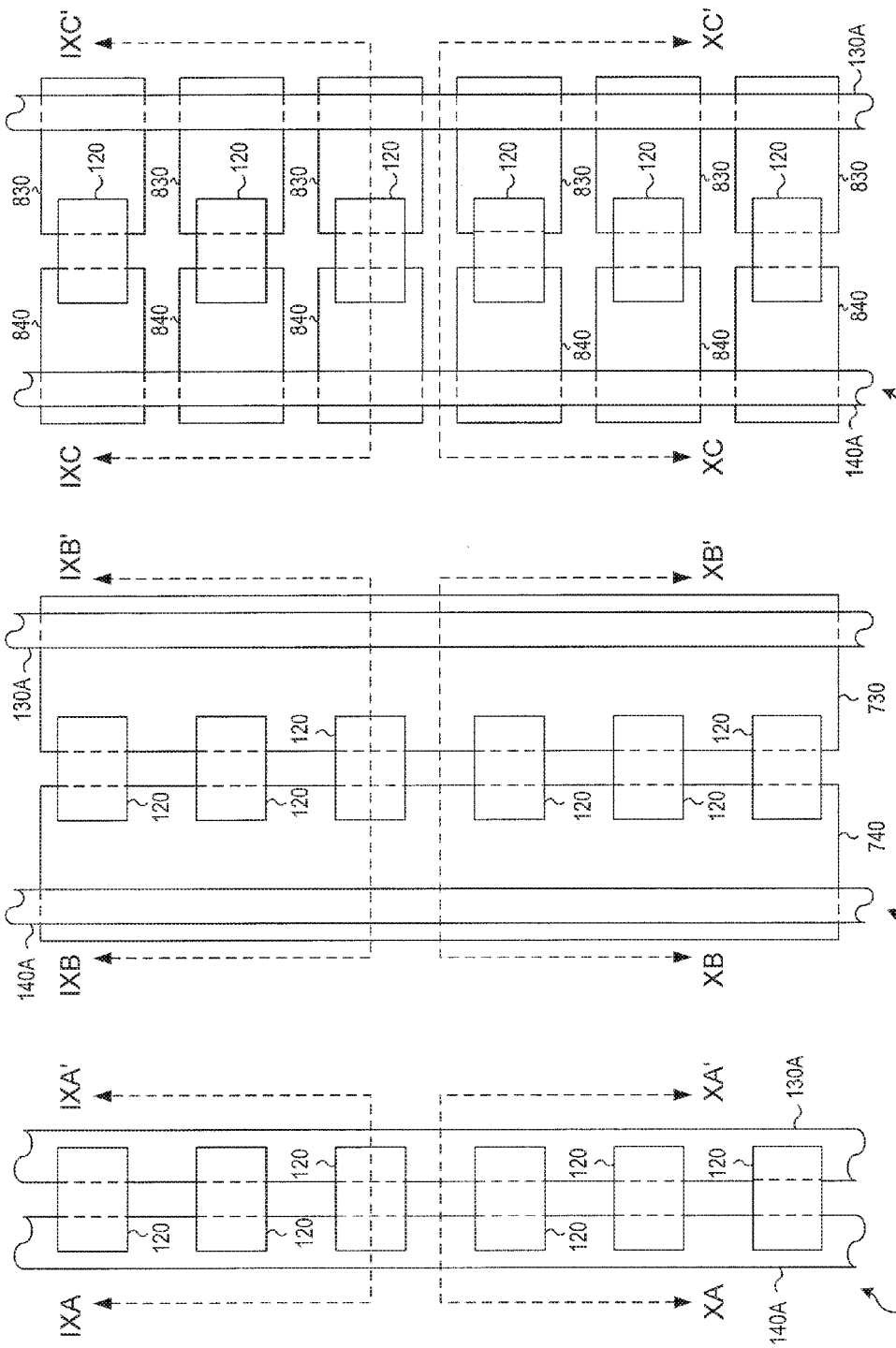

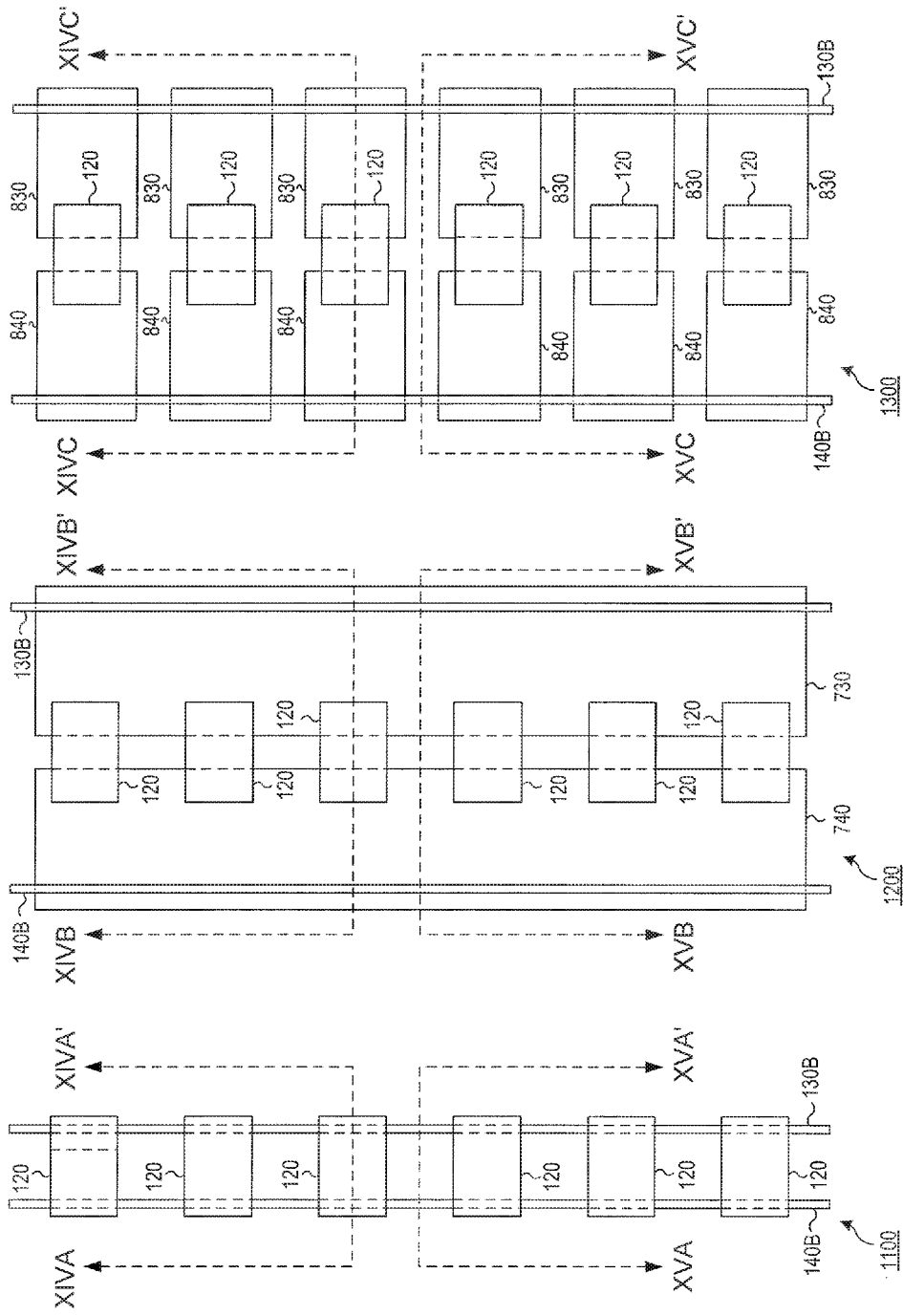

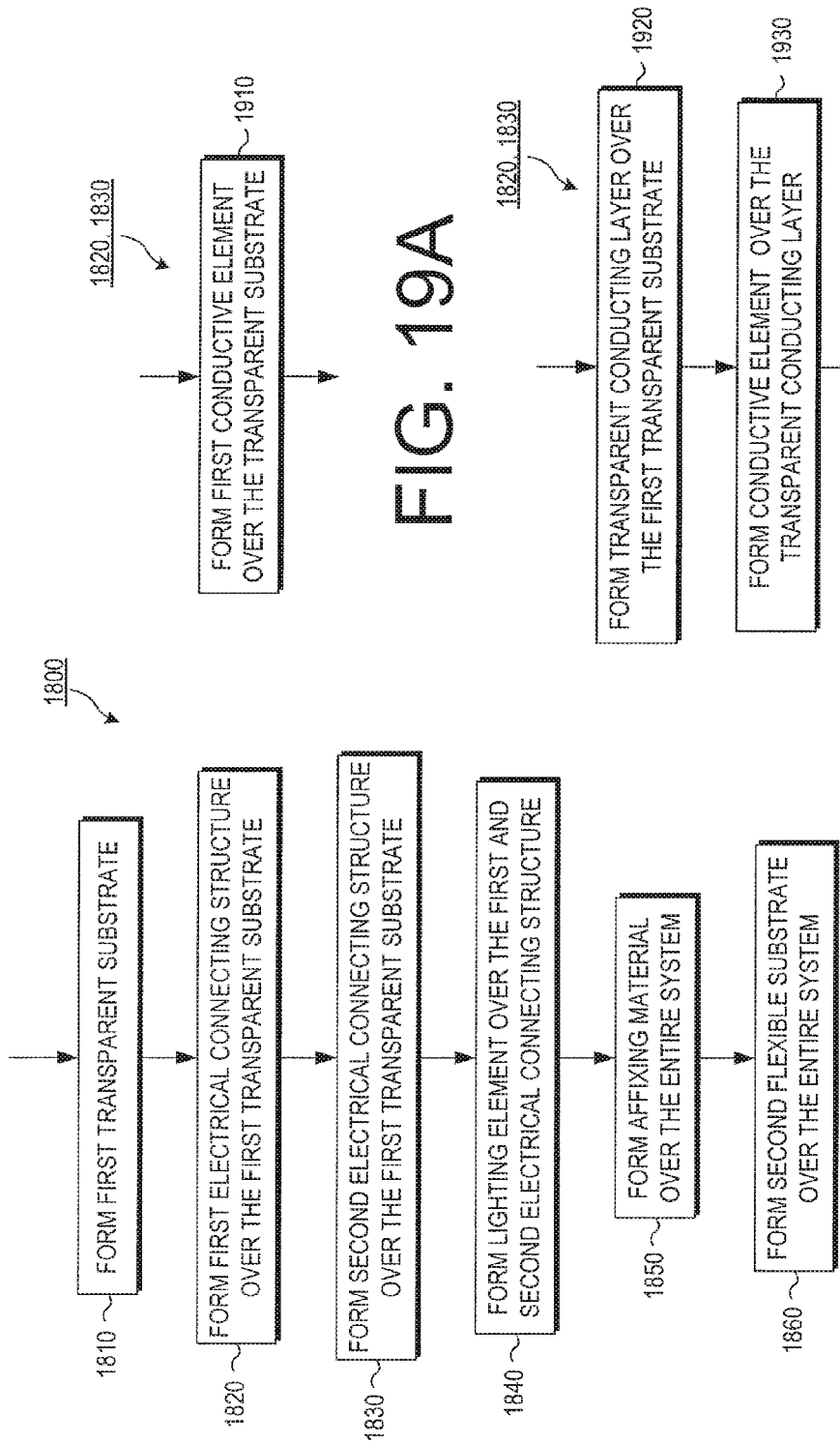

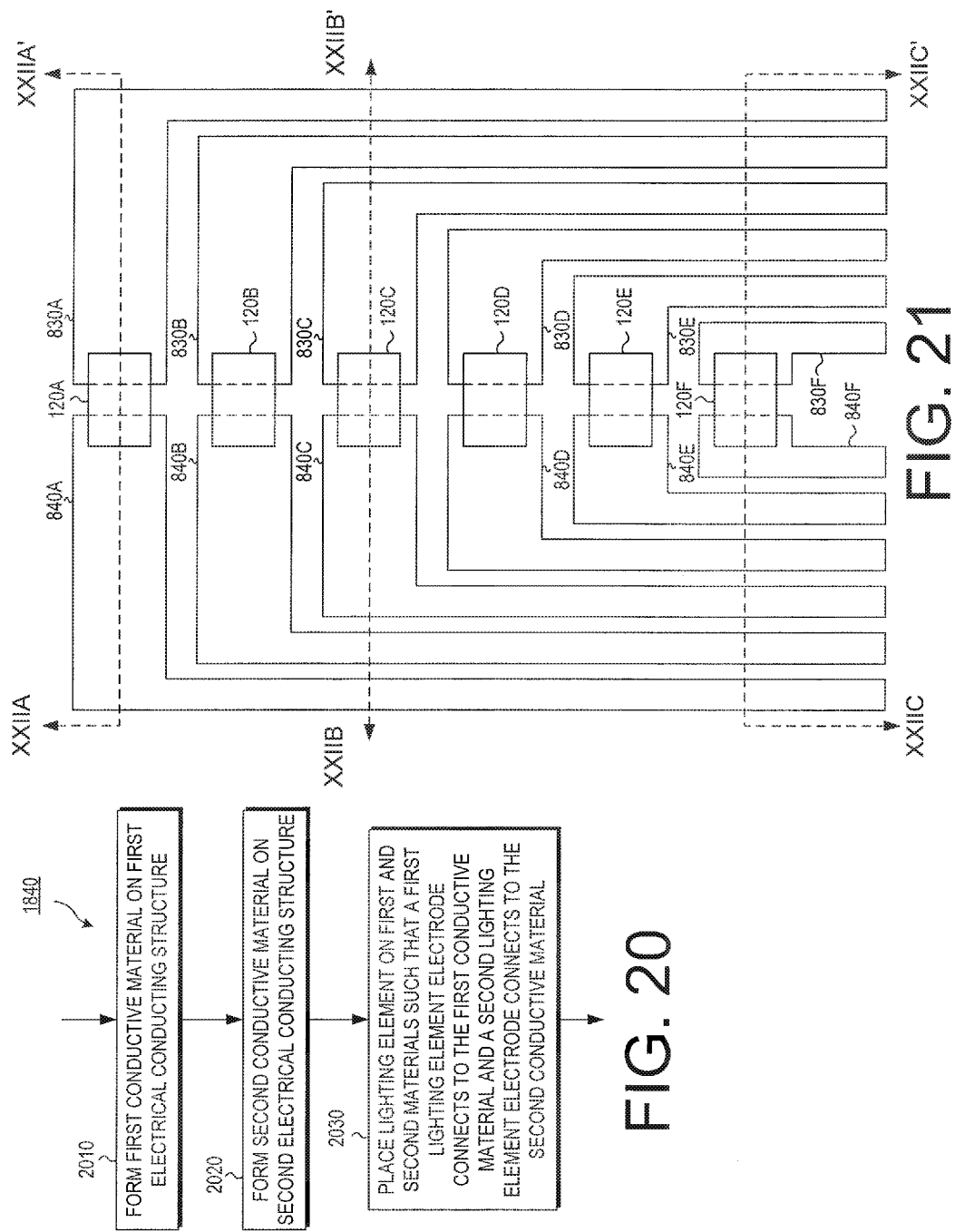

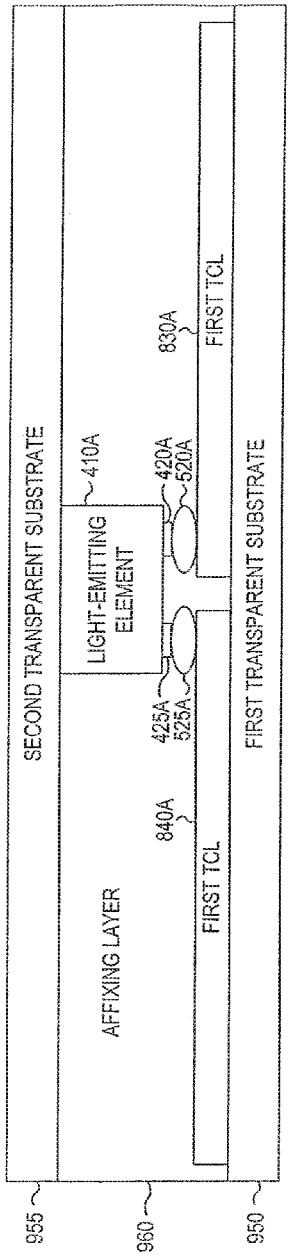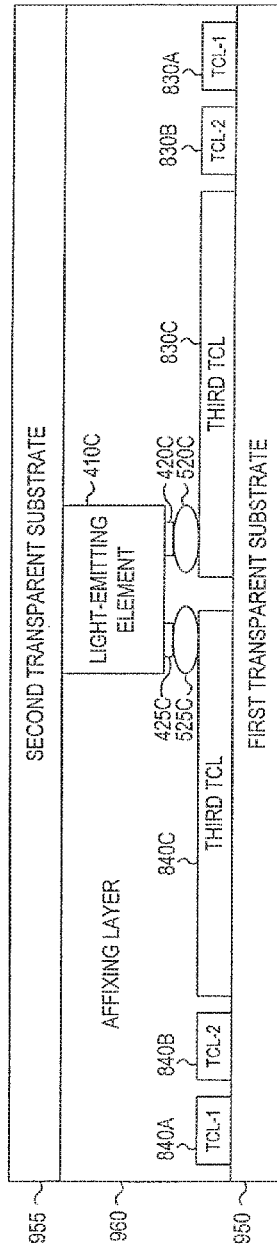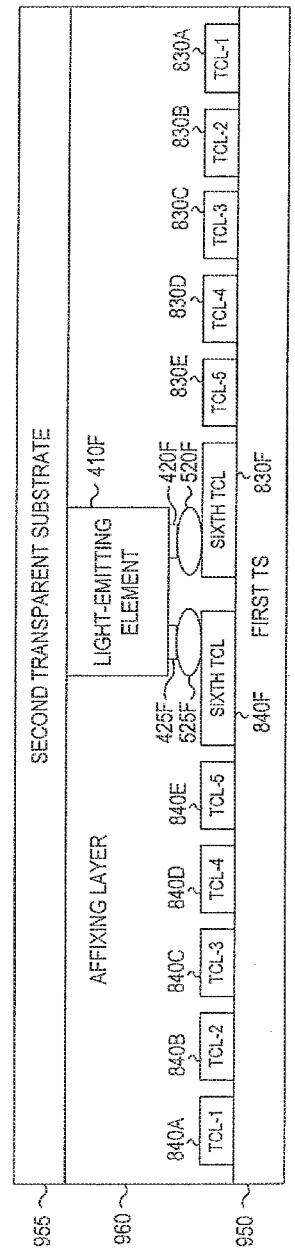

FLEXIBLE LIGHTING DEVICE HAVING UNOBTRUSIVE CONDUCTIVE LAYERS

CROSS REFERENCE TO RELATED APPLICATION

This application is a divisional of U.S. application Ser. No. 13/948,443 filed on Jul. 23, 2013, the disclosure of which is incorporated herein by reference.

FIELD OF THE INVENTION

The present invention relates generally to a thin, flexible device that contains a number of controllable lighting elements on it. More particularly, the present invention relates to a thin, flexible device containing a number of light-emitting diodes that can be controlled to light up, such that only the light-emitting diodes can be easily seen.

BACKGROUND OF THE INVENTION

Light-emitting diodes (LEDs) can be used to provide low-cost, low-power lighting in a variety of situations. However, because these designs can be complex, the resulting device can be relatively thick, limiting their usefulness in space-sensitive situations.

Furthermore, the desire to keep devices as thin as possible limits the size of the LEDs that can be used in a lighting device, thereby limiting the amount of light the lighting device can produce.

In addition, many LED devices are rigid devices, which limit their use in many situations by fixing their size and shape.

Also, for aesthetic reasons, many designers and consumers would like the LEDs alone to be visible in a lighting element, making them appear as if they were lights suspended in mid-air. However, the requirement to have conductive lines to control the operation of the LEDs has not allowed for such a design.

It would therefore be desirable to provide a thin, low-power, flexible lighting device that includes one or more relatively large lighting elements, but that can be easily manufactured in which all elements aside from the lighting elements were either transparent or at least very difficult to see with the naked eye.

SUMMARY OF THE INVENTION

A lighting element is provided, comprising: a first substrate; a first conductive element located on the first substrate; a second conductive element located on the first substrate; a light-emitting element having a first contact and a second contact, the first and second contacts both being on a first surface of the light-emitting element, the first contact being electrically connected to the first conductive element, the second contact being electrically connected to the second conductive element, and the light-emitting element being configured to emit light from a second surface opposite the first surface with the light having a first narrow range of wavelengths between 10 nm and 100,000 nm; a transparent layer located adjacent to the second surface of the light-emitting element; and a transparent affixing layer located between the first substrate and the transparent layer, the affixing layer being configured to affix the transparent layer to the first transparent substrate, wherein the transparent layer and the transparent affixing layer are both sufficiently transparent to visible light such that they will not decrease light transmittance below 70%, and the first and second conductive layers are at least partially transparent to visible light.

The lighting element may further comprise: a first transparent conductive layer formed at least partially adjacent to the first contact and at least partially adjacent to the first conductive element, the first transparent conductive layer configured to electrically connect the first contact and the first conductive element, wherein the first transparent conductive layer is sufficiently transparent to visible light such that it will not decrease light transmittance below 70%.

The lighting element may further comprise: a second transparent conductive layer formed at least partially adjacent to the second contact and at least partially adjacent to the second conductive element, the second transparent conductive layer configured to electrically connect the second contact and the second conductive element, wherein the second transparent conductive layer is sufficiently transparent to visible light such that it will not decrease light transmittance below 70%.

The light-emitting element may be configured to at least partially overlap at least one of the first and second conductive elements. The light-emitting element may be configured such that it does not overlap either of the first and second conductive elements.

The light-emitting element may be an ultrathin light-emitting element, having a thickness of between 3 mil and 20 mil. The transparent layer may be one of a second substrate and a hardened conformal coating. The first and second conductive elements may each comprise at least one of a conductive polymer strip, a nano-composite strip, a metal nanowire, a copper strip, an aluminum strip, a silver strip, and a strip containing an alloy of copper, aluminum, or silver. The first substrate may be sufficiently transparent to visible light such that it will not decrease light transmittance below 70%. The first and second conductive elements may both be buss bars.

A method of forming a lighting element is provided, comprising: forming a first substrate; applying a first conductive element over the first substrate; applying a second conductive element over the first substrate; installing a light-emitting element over the first substrate such that a first contact of the light-emitting element is electrically connected to the first conductive element and such that a second contact of the light-emitting element is electrically connected to the second conductive element, the first and second contacts both being on a first surface of the light-emitting element; forming an affixing layer over the first substrate; and forming a transparent layer over the light-emitting element and the affixing layer such that the affixing layer affixes the transparent layer to the first substrate, wherein the transparent layer and the transparent affixing layer are both sufficiently transparent to visible light such that they will not decrease light transmittance below 70%, the light-emitting element is configured to emit light having a first narrow range of wavelengths between 10 nm and 100,000 nm from the second surface; and the first and second conductive layers are both at least partially transparent to visible light.

The method may further comprise: forming a first transparent conductive layer at least partially adjacent to the first conductive element, wherein in the operation of installing the light-emitting element, the first contact is formed to be at least partially adjacent to the first transparent conductive layer, the first transparent conductive layer is configured to electrically connect the first contact and the first conductive element, and the first transparent conductive layer is sufficiently transparent to visible light such that it will not decrease light transmittance below 70%.

The light-emitting element may be installed to at least partially overlap the first conductive element.

The method may further comprise: forming a second transparent conductive layer at least partially adjacent to the second contact, wherein in the operation of installing the light-emitting element, the second contact is formed to be at least partially adjacent to the second transparent conductive layer, the second transparent conductive layer is configured to electrically connect the second contact and the second conductive element, and the second transparent conductive layer is sufficiently transparent to visible light such that it will not decrease light transmittance below 70%.

The light-emitting element may be installed to at least partially overlap both the first and the second conductive elements. The light-emitting element may be installed such that it does not overlap either of the first and second conductive elements. The light-emitting element may be an ultrathin light-emitting element, having a thickness of between 3 mil and 20 mil. The transparent layer may be one of a second substrate and a hardened conformal coating. The first and second conductive elements may each comprise at least one of a conductive polymer strip, a nano-composite strip, a metal nanowire, a copper strip, an aluminum strip, a silver strip, and a strip containing an alloy of copper, aluminum, or silver. The first substrate may be sufficiently transparent to visible light such that it will not decrease light transmittance below 70%. The first and second conductive elements may both be buss bars.

A lighting element is provided, comprising: a first substrate; a first conductive element located over the first substrate; a second conductive element located over the first substrate; a light-emitting element having a first contact and a second contact, the first and second contacts both being on a first surface of the light-emitting element, the first contact being electrically connected to the first conductive element, the second contact being electrically connected to the second conductive element, and the first light-emitting element being configured to emit light having a first narrow range of wavelengths between 10 nm and 100,000 nm from a second surface opposite from the first surface; a transparent layer located adjacent to the second surface of the light-emitting element; and a transparent affixing layer located between the first substrate and the transparent layer, the transparent affixing layer being configured to affix the transparent layer to the first substrate, wherein the transparent layer and the transparent affixing layer are both sufficiently transparent to visible light such that they will not decrease light transmittance below 70%, and the first and second conductive layers are 300 μm or smaller in width.

The lighting element may further comprise: a first transparent conductive layer formed at least partially adjacent to the first contact and at least partially adjacent to the first conductive element, the first transparent conductive layer configured to electrically connect the first contact and the first conductive element, wherein the first transparent conductive layer is sufficiently transparent to visible light such that it will not decrease light transmittance below 70%.

The light-emitting element may be configured to at least partially overlap the first conductive element.

The lighting element may further comprise: a second transparent conductive layer formed at least partially adjacent to the second contact and at least partially adjacent to the second conductive element, the second transparent conductive layer configured to electrically connect the second contact and the second conductive element, wherein the second transparent conductive layer is sufficiently transparent to visible light such that it will not decrease light transmittance below 70%.

The light-emitting element may be configured to at least partially overlap the first and second conductive elements. The light-emitting element may be configured such that it does not overlap either of the first and second conductive elements. The transparent layer may be one of a second substrate and a hardened conformal coating. The first and second conductive elements may each comprise a conductive metal. The first and second conductive elements may each comprise at least one of: thin layers of copper, aluminum, silver, alloys of copper, aluminum, or silver, and nano-composites containing copper, aluminum, or silver. The first and second conductive elements may both be metal wires.

A method of forming a lighting element is provided, comprising: forming a first substrate; applying a first conductive element over the first substrate; applying a second conductive element over the first substrate; installing a light-emitting element over the first substrate such that a first contact of the light-emitting element is electrically connected to the first conductive element and such that a second contact of the light-emitting element is electrically connected to the second conductive element, the first and second contacts both being on a first surface of the light-emitting element; applying a transparent affixing layer over the first substrate; and applying a transparent layer over the light-emitting element and the transparent affixing layer such that the transparent affixing layer affixes the transparent layer to the first substrate, wherein the transparent layer and the transparent affixing layer are both sufficiently transparent to visible light such that they will not decrease light transmittance below 70%, the light-emitting element is configured to emit light having a first narrow range of wavelengths between 10 nm and 100,000 nm from the second surface, and the first and second conductive layers are 300 μm or smaller in width.

The method may further comprise: applying a first transparent conductive layer at least partially adjacent to the first conductive element, wherein in the operation of installing the light-emitting element, the first contact is formed to be at least partially adjacent to the first transparent conductive layer, the first transparent conductive layer is configured to electrically connect the first contact and the first conductive element, and the first transparent conductive layer is sufficiently transparent to visible light such that it will not decrease light transmittance below 70%.

The light-emitting element may be installed to at least partially overlap the first conductive element.

The method may further comprise: applying a second transparent conductive layer at least partially adjacent to the second contact, wherein in the operation of installing the light-emitting element, the second contact is formed to be at least partially adjacent to the second transparent conductive layer, the second transparent conductive layer is configured to electrically connect the second contact and the second conductive element, and the second transparent conductive layer is sufficiently transparent to visible light such that it will not decrease light transmittance below 70%.

The light-emitting element may be installed to at least partially overlap both the first and the second conductive elements. The light-emitting element may be installed such that it does not overlap either of the first and second conductive elements. The light-emitting element may be an ultrathin light-emitting element, having a thickness of between 3 mil and 20 mil. The transparent layer may be one of a second substrate and a hardened conformal coating. The first and second conductive elements may each comprise at least one of: copper, aluminum, silver, alloys of copper, aluminum, or silver, and nano-composites containing copper, aluminum, or silver. The first substrate may be sufficiently transparent to visible light such that it will not decrease light transmittance below 70%. The first and second conductive elements may both be metal wires.

A lighting element is provided, comprising: a first substrate; a first conductive element located on the first substrate; a second conductive element located on the first substrate; a light-emitting element having a first contact and a second contact, the first and second contacts both being on a first surface of the light-emitting element, the first contact being electrically connected to the first conductive element, the second contact being electrically connected to the second conductive element, and the light-emitting element being configured to emit light having a first narrow range of wavelengths between 10 nm and 100,000 nm from a second surface opposite the first surface; a transparent layer located adjacent to the second surface of the light-emitting element; a transparent affixing layer located between the first substrate and the transparent layer, the transparent affixing layer being configured to affix the transparent layer to the first substrate; and an opaque design feature formed over at least one of the first conductive element and the second conductive element, the opaque design at least partially obscuring at least one of the first conductive element and the second conductive element from above, wherein the transparent layer and the transparent affixing layer are both sufficiently transparent to visible light such that they will not decrease light transmittance below 70%.

The opaque design may fully obscure at least one of the first conductive element and the second conductive element from above.

The lighting element may further comprise: a first transparent conductive layer applied at least partially adjacent to the first contact and at least partially adjacent to the first conductive element, the first transparent conductive layer configured to electrically connect the first contact and the first conductive element, wherein the first transparent conductive layer is sufficiently transparent to visible light such that it will not decrease light transmittance below 70%.

The lighting element may further comprise: a second transparent conductive layer formed at least partially adjacent to the second contact and at least partially adjacent to the second conductive element, the second transparent conductive layer configured to electrically connect the second contact and the second conductive element, wherein the second transparent conductive layer is sufficiently transparent to visible light such that it will not decrease light transmittance below 70%.

The light-emitting element may be configured to at least partially overlap at least one of the first and second conductive elements. The light-emitting element may be configured such that it does not overlap either of the first and second conductive elements. The light-emitting element may be an ultrathin light-emitting element, having a thickness of between 3 mil and 20 mil. The transparent layer may be one of a second substrate and a hardened transparent conformal coating.

The opaque design feature may comprise: a first opaque design element formed over the first conductive element, the first opaque design element at least partially obscuring the first conductive element from above; and a second opaque design element formed over the second conductive element, the second opaque design element at least partially obscuring the second conductive element from above.

The first and second conductive elements may both be buss bars. The first and second conductive elements may both be at least partially transparent to the selected wavelengths of light. The opaque design feature may be an ornamental decoration, a frame, optical patterns created by films, or frames of supporting structures.

A method of forming a lighting element is provided, comprising: forming a first substrate; applying a first conductive element on the first substrate; applying a second conductive element on the first substrate; connecting a positive contact of a light-emitting element to the first conductive element through the first conductive connector, such that the first conductive connector electrically connects the first conductive element to the positive contact; connecting a negative contact of the light-emitting element to the second conductive element through the second conductive connector, such that the second conductive electrically connects the second conductive element to the negative contact; applying a transparent affixing layer over the first flexible substrate; applying a transparent layer over the light-emitting element and the transparent affixing layer such that the transparent affixing layer affixes the transparent layer to the first substrate; and applying an opaque design feature over at least one of the first conductive element and the second conductive element, the opaque design feature at least partially concealing at least one of the first conductive element and the second conductive element from above, wherein the transparent layer and the transparent affixing layer are both sufficiently transparent to visible light such that they will not decrease light transmittance below 70%, the positive and negative contacts are both on a first side of the light-emitting element, and the light-emitting element is configured to emit light in the selected wavelengths of light.

The opaque design may be applied to fully obscure at least one of the first conductive element and the second conductive element from above.

The method may further comprise: applying a first transparent conductive layer at least partially adjacent to the first conductive element, wherein in the operation of installing the light-emitting element, the first contact is applied to be at least partially adjacent to the first transparent conductive layer, the first transparent conductive layer is configured to electrically connect the first contact and the first conductive element, and the first transparent conductive layer is sufficiently transparent to visible light such that it will not decrease light transmittance below 70%.

The light-emitting element may be installed to at least partially overlap the first conductive element.

The method may further comprise: applying a second transparent conductive layer at least partially adjacent to the second contact, wherein in the operation of installing the light-emitting element, the second contact is applied to be at least partially adjacent to the second transparent conductive layer, the second transparent conductive layer is configured to electrically connect the second contact and the second conductive element, and the second transparent conductive layer is sufficiently transparent to visible light such that it will not decrease light transmittance below 70%.

The light-emitting element may be installed to at least partially overlap both the first and the second conductive elements. The light-emitting element may be installed such that it does not overlap either of the first and second conductive elements. The light-emitting element may be an ultrathin light-emitting element, having a thickness of between 3 mil and 20 mil. The transparent layer may be one of a second substrate and a hardened conformal coating.

The operation of forming an opaque design feature may comprise: applying a first opaque design feature over the first conductive element, the first opaque design at least partially concealing the first conductive element from above; and applying a second opaque design feature over the second conductive element, the second opaque design at least partially concealing the second conductive element from above.

The first and second conductive elements may both be buss bars. The opaque design feature may be an ornamental decoration, a mask, a filter, a frame, optical patterns created by films, or frames of supporting structures. The first and second conductive elements may be applied on the outer periphery of the first substrate.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

FIG. 1 is an overhead view of a flexible lighting device according to a disclosed embodiment;

FIG. 2 is an overhead cross-sectional view of two lighting elements from the flexible lighting device of FIG. 1 according to disclosed embodiments;

FIG. 3 is a circuit diagram showing the electrical connections of a lighting structure of FIG. 2 according to disclosed embodiments;

FIG. 4 is a side cross-sectional view of the single lighting element of FIG. 2 according to disclosed embodiments;

FIG. 5 is a side cross-sectional view of the single lighting structure of FIG. according to disclosed embodiments;

FIG. 6 is an overhead view of a portion of a lighting device having semi-transparent conductive elements according to a disclosed embodiment;

FIG. 7 is an overhead view of a portion of a lighting device having semi-transparent conductive elements according to another disclosed embodiment;

FIG. 8 is an overhead view of a portion of a lighting device having semi-transparent conductive elements according to yet another disclosed embodiment;

FIG. 11 is an overhead view of a portion of a lighting device having thin wire conductive elements according to a disclosed embodiment;

FIG. 12 is an overhead view of a portion of a lighting device having thin wire conductive elements according to another disclosed embodiment;

FIG. 13 is an overhead view of a portion of a lighting device having thin wire conductive elements according to yet another disclosed embodiment;

FIG. 18 is a flow chart showing a manufacturing process of a flexible lighting device according to a disclosed embodiment;

FIGS. 19A and 19B are flow charts showing a process of forming a first/second electrical connecting structure over a first transparent substrate from FIG. 18 according to disclosed embodiments;

FIG. 20 is a flow chart showing a process of forming a light element over first and second connecting structures from FIG. 18 according to a disclosed embodiment;

FIG. 21 is an overhead view of a portion of a lighting device in which individual lighting elements can be selectively activated according to yet another disclosed embodiment.

FIG. 22A is a side cross-sectional view of the flexible lighting device of FIG. 21 along the line XVIIA-XVIIA' according to a disclosed embodiment;

FIG. 22B is a side cross-sectional view of the flexible lighting device of FIG. 21 along the line XVIIB-XVIIB' according to a disclosed embodiment; and FIG. 22C is a side cross-sectional view of the flexible lighting device of FIG. 21 along the line XVIIC-XVIIC' according to a disclosed embodiment.

DETAILED DESCRIPTION

Figure 9A:
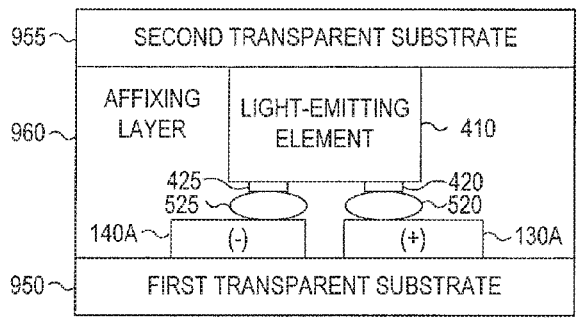
FIG. 9A is a side cross-sectional view of the portion of a lighting device of FIG. 6 along the line IXA-IXA' according to a disclosed embodiment.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

Flexible Lighting Device Structure

FIG. 1 is an overhead view of a flexible lighting device 100 according to a disclosed embodiment. As shown in FIG. 1, the flexible lighting device 100 includes a flexible ribbon 110 containing a plurality of lighting elements 120, a positive conductive element 130, and a negative conductive element 140, a control circuit 150, a cable sheath 160, and a cable 170.

The flexible ribbon 110 serves to give structure and protection to the plurality of lighting elements 120 and the positive and negative conductive elements 130, 140.

The plurality of lighting elements 120 operate to generate light based on currents received from the control circuit 150 through the positive and negative conductive elements 130, 140. In the disclosed embodiments, the lighting elements 120 contain light-emitting elements. In some embodiments these lighting-emitting elements could be light-emitting diodes (LEDs) that emit light of a particular wavelength. In other embodiments the light-emitting elements could be LEDs with phosphorus coatings that serve to scatter single-color light generated by the LEDs to make it white light. In still other embodiments the light-emitting elements could be LEDs that include lenses to focus, diffuse, or color the light.

The positive conductive element 130 serves as a means for connecting one node of each of the plurality of lighting elements 120 to a positive voltage signal from the control circuit 150. Likewise, the negative conductive element 140 serves as a means for connecting another node of each of the plurality of lighting elements 120 to a negative voltage signal from the control circuit 150. In the embodiment disclosed in FIG. 1, the positive and negative conductive elements 130, 140 can be any suitable structure that serves to electrically connect nodes of the plurality of lighting elements 120 to positive and negative voltage signals from the control circuit 150. In the alternative, the negative conductive element 140 may serve as a means for connecting the other node in each of the plurality of lighting elements 120 to a ground voltage. Where a negative voltage signal is referred to in this disclosure, it can also mean a ground voltage.

In alternate embodiments multiple positive conductive elements 130 and negative conductive elements 140 could be provided so that different lighting elements 120 could be connected to different positive and negative conductive element 130, 140, thus allowing greater control of the operation of individual lighting elements 120.

Furthermore, although the positive and negative conductive elements 130, 140 are shown in a particular position in FIG. 1, in alternate embodiments they can be placed at various positions on the lighting device.

The control circuit 150 provides positive and negative voltage signals across the positive and negative conductive elements 130, 140, respectively, in order to control the operation of the plurality of lighting elements 120. When the control circuit 150 supplies proper voltages to the positive and negative conductive elements 130, 140, the plurality of lighting elements 120 will turn on and emit light. When the control circuit 150 stops providing the proper voltages to the positive and negative conductive elements 130, 140, the plurality of lighting elements 120 will turn off and cease emitting light.

The cable sheath 160 serves to protect the cable 170 from damage, while the cable 170 provides power and control signals to the control circuit 150.

In operation, the control circuit 150 will either have a set pattern for operating the plurality of lighting elements 120, or will receive lighting control signals from an external source indicating how it should operate the plurality of lighting elements 120. Based on the set pattern or the lighting control signals, the control circuit 150 will provide appropriate voltages to the positive and negative conductive elements 130, 140 to activate the plurality of lighting elements 120 at desired times.

FIG. 2 is an overhead cross-sectional window 180 of two lighting elements 120 from the flexible lighting device 100 of FIG. 1 according to disclosed embodiments. As shown in FIG. 2, the cross-sectional window 180 discloses that the lighting element 120 are formed in a lighting structure 210, in which first and second contact elements (not shown) are connected to the positive conductive element 130 and the negative conductive element 140, respectively.

The lighting structure 210 is configured to emit light, such as light of a specific wavelength (e.g., ultraviolet light, blue light, green light, infrared light, or any light with a wavelength between 10 nm and 100,000 nm) or light in a range of wavelengths (e.g., white light). In some embodiments the lighting elements 120 can include LEDs that emit light of a particular wavelength; in other embodiments the lighting elements 120 can include LEDs that emit light in a particular range of wavelengths; and in still other embodiments the lighting elements 120 can include LEDs that include lenses to focus, diffuse, or color the light.

In the various disclosed embodiments, the first and second contact elements are provided on the same side of the lighting element 120. As a result of this, the lighting element 120 can be connected to the positive and negative conductive elements 130, 140 with a minimum of connective circuitry, thereby minimizing the thickness of the lighting structure 210, and therefore the thickness of the entire flexible lighting device 100. In one particular embodiment, the lighting structure 210 contains a flip-chip LED.

FIG. 3 is a circuit diagram showing the electrical connections of lighting structure 210 in the cross-sectional window 180 of FIG. 2 according to disclosed embodiments. As shown in FIG. 3, a lighting element 120 is electrically connected to a positive conductive element 130 through a first conductive element 320. Similarly, the lighting element 120 is electrically connected to a negative conductive element 140 through a second conductive element 325.

FIG. 4 is a side cross-sectional view of the lighting element 120 of FIG. 2 according to a disclosed embodiment. As shown in FIG. 4, the lighting element 120 in this embodiment includes a light-emitting element 410 having first and second contact elements 420, 425.

The light-emitting element 410 is configured to emit light, such as light of a specific wavelength (e.g., ultraviolet light, blue light, green light, infrared light, or any light with a wavelength between 10 nm and 100,000 nm), or light in a range of wavelengths (e.g., white light).

The first and second contact elements 420, 425 provide an external means for the light-emitting element 410 to be electrically connected to the positive and negative conductive element 130, 140. In the disclosed embodiments the first and second contact elements 420, 425 are contact pads. However, in alternate embodiments they could be any suitable means of electrically connecting the light-emitting element 410 with external elements. For example, in some alternate embodiments the first and second contact elements 420, 425 could be contact pins. When the light-emitting element 410 is an LED, the first contact element 420 is an anode, and the second contact element 425 is a cathode.

FIG. 5 is a side cross-sectional view of the lighting structure 210 of FIG. 2 according to a disclosed embodiment. As shown in FIG. 5, the lighting structure 210 in this embodiment includes a light-emitting element 410 having first and second contact elements 420, 425. Furthermore, the first contact element 420 is connected to a first conductive connector 520, while the second contact element 425 is connected to a second conductive connector 525.

The light-emitting element 410 and the first and the second contact elements 420, 425 operate as described above. As a result, the description will not be repeated here.

The first and second conductive connectors 520, 525 are configured to electrically connect the lighting element 120 to the positive and negative conductive elements 130, 140. In particular, the first contact element 420 is connected to the positive conductive element 130 through the first conductive connector 520. Likewise, the second contact element 425 is connected to the negative conductive element 140 through the second conductive connector 525.

Because the first and second contact elements 420, 425 are both formed on the same side of the light-emitting element 410, the first and second conductive connectors 520, 525 can likewise be placed on the same side of the light-emitting element 410. As a result, a relatively small connection distance is required to connect the first and second contact elements fourth 20, 425 to the positive and negative conductive elements 130, 140. This allows for a thinner lighting element 120, as compared to a lighting element that employs a light-emitting element with contact elements formed on opposite sides of the light-emitting element.

In various embodiments, the conductive connectors 520, 525 can be: silver epoxy dots, conductive adhesive, metal pads, or other suitably conductive metal elements.

In an effort to make the ribbon 110 as appealing to the eye as possible, transparent materials are used wherever possible in the lighting device 100. At present, however, no truly transparent materials are available for the positive and negative conductive elements 130, 140. Therefore, several solutions are disclosed for making the positive and negative conductive elements 130, 140 as unobtrusive as possible to the naked eye. These solutions include: (1) using a semi-transparent material for the positive and negative conductive elements 130, 140; (2) using a thin wire for the positive and negative conductive elements 130, 140; and (3) obscuring the positive and negative conductive elements 130, 140 with a design feature of the lighting device 100.

Flexible Lighting Device Using Semi-Transparent Conductive Elements

FIG. 6 is an overhead view of a portion of a lighting device 600 having semi-transparent conductive elements according to a disclosed embodiment. As shown in FIG. 6, the portion of a lighting device 600 includes a plurality of lighting elements 120, a semi-transparent positive conductive element 130A, and a semi-transparent negative conductive element 140A.

In this embodiment, the plurality of lighting elements 120 are formed directly above at least a portion of each of the semi-transparent positive conductive elements 130A and the semi-transparent negative conductive element 140A. As a result, a first contact element (not shown in FIG. 6) can connect directly to the semi-transparent positive conductive element 130A (e.g., it can connect directly via a first conductive connector, also not shown in FIG. 6). Similarly, a second contact element (not shown in FIG. 6) can connect directly to the semi-transparent negative conductive element 140A (e.g., it can connect directly via a second conductive connector, also not shown in FIG. 6).

FIG. 7 is an overhead view of a portion of a lighting device 700 having semi-transparent conductive elements according to another disclosed embodiment. As shown in FIG. 7, the portion of the lighting device 700 includes a plurality of lighting elements 120, a first connecting layer 730, a second connecting layer 740, a semi-transparent positive conductive element 130A, and a semi-transparent negative conductive element 140A.

In this embodiment, the plurality of lighting elements 120 are not formed directly over the semi-transparent positive and negative conductive elements 130A, 140A. As a result, this embodiment requires a first connecting layer 730 to electrically connect first contact elements (not shown in FIG. 7) to the semi-transparent positive conductive element 130A, and a second connecting layer 740 to electrically connect second contact elements (not shown in FIG. 7) to the semi-transparent negative conductive element 140A. In this disclosed embodiment, the first connecting layers 730, 740 may both be transparent conductive oxide (TCO) layers.

FIG. 8 is an overhead view of a portion of a lighting device 800 having semi-transparent conductive elements according to yet another disclosed embodiment. As shown in FIG. 8, the portion of the lighting device 800 includes a plurality of lighting elements 120, a plurality of first connecting layers 830, a plurality of second connecting layers 840, a semi-transparent positive conductive element 130A, and a semi-transparent negative conductive element 140A.

As with the embodiment of FIG. 7, the plurality of lighting elements 120 in this embodiment are not applied directly over the semi-transparent positive and negative conductive elements 130A, 140A. As a result, the plurality of first connecting layers 830 are provided to electrically connect first contact elements (not shown in FIG. 8) to the semi-transparent positive conductive element 130A, and the plurality of second connecting layers 840 are provided to electrically connect second contact elements (not shown in FIG. 8) to the semi-transparent negative conductive element 140A. In this disclosed embodiment, the plurality of first and second connecting layers 830, 840 may all be transparent conductive oxide (TCO) layers.

In each of FIGS. 6-8, a semi-transparent material is used for the positive and negative conductive elements 130A, 140A. Although not entirely transparent, such semi-transparent materials can serve to obscure the positive and negative conductive elements 130A, 140A, making them difficult to see, particularly from a distance. In various embodiments, the semitransparent material used for the positive and negative conductive elements 130A, 140A can include copper, silver, aluminum, alloys of these elements, and other metals.

It should be understood that although the designs in FIGS. 6-8 are all shown as being symmetrical, this is not required. In other words, in alternate embodiments the plurality of lighting elements 120 could be formed directly over one of the semi-transparent conductive elements 130A, 140A, but require a connecting layer to connect to the other semi-transparent conductive element 130A, 140A. Furthermore, the exact displacement of the semi-transparent conductive elements 130A, 140A with respect to the lighting elements 120 can vary.

FIG. 9A is a side cross-sectional view of the portion of a lighting device 600 of FIG. 6 along the line IXA-IXA' according to a disclosed embodiment. As shown in FIG. 9A, the portion of a lighting device 600 includes a first transparent substrate 950, semi-transparent positive and negative conductive elements 130A, 140A, a light-emitting element 410, first and second contact elements 420, 425, first and second conductive connectors 520, 525, a second transparent substrate 955, and an affixing layer 960.

The first transparent substrate 950 serves as a base for the remainder of the lighting device 600. As a reference direction, the first transparent substrate 950 can be considered to be a "bottom" substrate upon which the other elements are stacked. However, this is as a point of reference only. The lighting device 600 has no inherent direction, and can be oriented in any manner, even with the first transparent substrate 950 being on the "top" of the structure.

The first transparent substrate 950 can be made of polyethylene terephthalate (PET), polyethylene napthalate (PEN), polyester, a polymer, an oxide-coated polymer, a flexible plastic, or any suitable material that is transparent to visible light. In alternate embodiments, the substrate 950 need not be transparent, and can simply serve as a backdrop for the lighting elements 120. In such an embodiment, it should be referred to as simply a first substrate 950. In embodiments in which the entire lighting device 600 is required to be flexible, the first transparent substrate 950 should be made of a flexible material.

The semi-transparent positive and negative conductive elements 130A, 140A are located on top of the first transparent substrate 950. Each is made of a semi-transparent conductive material that is connected to the control circuit 150, and is configured to carry a control current generated by the control circuit 150 to the lighting device 600. In various embodiments, the semi-transparent positive and negative conductive elements 130A, 140A can be made of thin layers of metals, conductive polymers, or transparent conductive oxides.

Figure 10A:
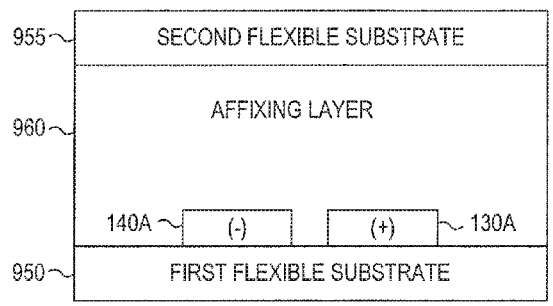
FIG. 10A is a side cross-sectional view of the portion of a lighting device of FIG. 6 along the line XA-XA' according to a disclosed embodiment.

In the embodiments disclosed in FIGS. 6, 9A, and 10A, the semi-transparent positive and negative conductive elements 130A, 140A are semi-transparent buss bars used to conduct electricity throughout the flexible lighting device 600. These semi-transparent buss bars are made of a material that is at least partially transparent to visible light. For example, the positive and negative conductive elements 130A, 140A in these embodiments can be made of thin layers of metals, conductive polymers, or transparent conductive oxides. In alternate embodiments they can be formed from any suitable semi-transparent structure used to conduct electricity throughout the flexible lighting device 600.

Figure 9B:
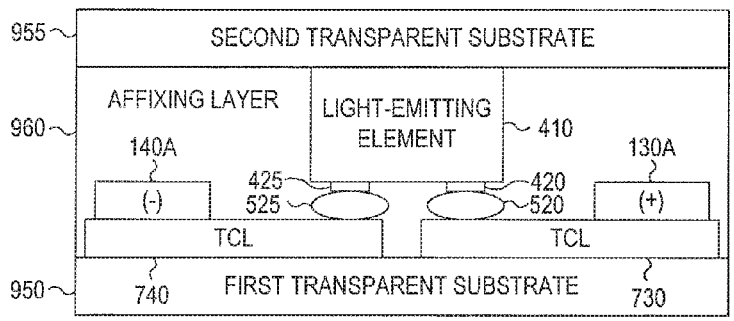
FIG. 9B is a side cross-sectional view of the portion of a lighting device of FIG. 7 along the line IXB-IXB' according to a disclosed embodiment.

FIG. 9B is a side cross-sectional view of the portion of a lighting device 700 of FIG. 7 along the line IXB-IXB' according to a disclosed embodiment. As shown in FIG. 9B, the portion of a lighting device 700 includes a first transparent substrate 950, first and second transparent connecting layers 730, 740, semi-transparent positive and negative conductive elements 130A, 140A, a light-emitting element 410, first and second contact elements 420, 425, first and second conductive connectors 520, 525, a second transparent substrate 955, and an affixing layer 960.

As shown in FIG. 9B, the first and second transparent connecting layers 730, 740 are applied over the first transparent substrate 950, and the semi-transparent positive and negative conductive elements 130B, 140B are formed over the first and second transparent connecting layer 730, 740, respectively. The light-emitting element 410 is formed over the first and second transparent connecting layers 730, 740 such that a first contact element 420 connects to the first transparent connecting layer 730 through the first conductive connector 520, and such that a second contact element 425 connects to the second transparent connecting layer 740 through the second conductive connector 525.

The first and second transparent connecting layers 730, 740 can be made of any suitable transparent conducting material. For example, the first and second transparent connecting layer 730, 740 may be made of a transparent conducting oxide such as doped and undoped indium oxide, tin oxides and zinc oxides.

Figure 9C:
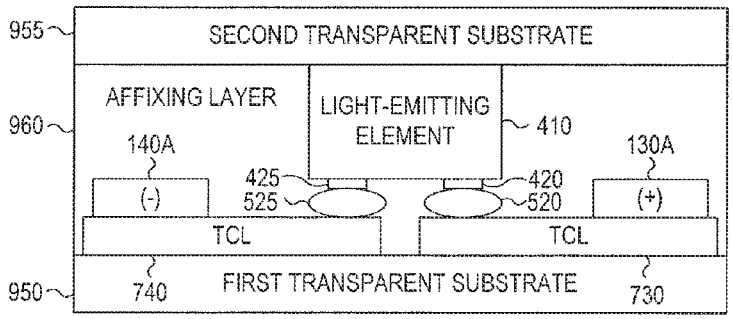
FIG. 9C is a side cross-sectional view of the portion of a lighting device of FIG. 8 along the line IXC-IXC' according to a disclosed embodiment.

FIG. 9C is a side cross-sectional view of the portion of a lighting device 800 of FIG. 8 along the line IXC-IXC' according to a disclosed embodiment. As shown in FIG. 9C, the portion of a lighting device 800 includes a first transparent substrate 950, first and second transparent connecting layers 830, 840, semi-transparent positive and negative conductive elements 130A, 140A, a light-emitting element 410, first and second contact elements 420, 425, first and second conductive connectors 520, 525, a second transparent substrate 955, and an affixing layer 960.

FIG. 9C is similar to FIG. 9B, except that the transparent conducting layers 830, 840 represent an individual conducting layer for the light-emitting element 410. The transparent conducting layers 830, 840 can be made the same or similar material to be first and second transparent conductive layers 730, 740 in the embodiment of FIGS. 7, 9B, and 10B.

FIG. 10A is a side cross-sectional view of the portion of a lighting device 600 of FIG. 6 along the line XA-XA' according to a disclosed embodiment. This cross-sectional view shows a point between lighting elements 120. As shown in FIG. 10A, the portion of a lighting device 600 includes a first transparent substrate 950, semi-transparent positive and negative conductive elements 130A, 140A, a second transparent substrate 955, and an affixing layer 960.

FIG. 10A is similar to FIG. 9A, save that the light-emitting element 410 and its connectors are not present. However, because the semi-transparent positive and negative conductive elements 130A, 140A extend the length of the flexible ribbon 110, they are present between lighting elements 120.

Figure 10B:
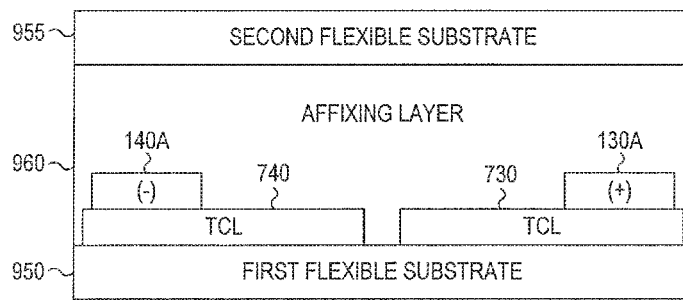
FIG. 10B is a side cross-sectional view of the portion of a lighting device of FIG. 7 along the line XB-XB' according to a disclosed embodiment.

FIG. 10B is a side cross-sectional view of the portion of a lighting device 700 of FIG. 7 along the line XB-XB' according to a disclosed embodiment. This cross-sectional view shows a point between lighting elements 120. As shown in FIG. 10B, the portion of a lighting device 700 includes a first transparent substrate 950, semi-transparent positive and negative conductive elements 130A, 140A, first and second transparent conducting layers 730, 740, a second transparent substrate 955, and an affixing layer 960.

FIG. 10B is similar to FIG. 9B, save that the light-emitting element 410 and its connectors are not present. However, because the semi-transparent positive and negative conductive elements 130A, 140A and the first and second transparent conducting layers 730, 740 extend the length of the flexible ribbon 110, they are present between lighting elements 120.

Figure 10C:
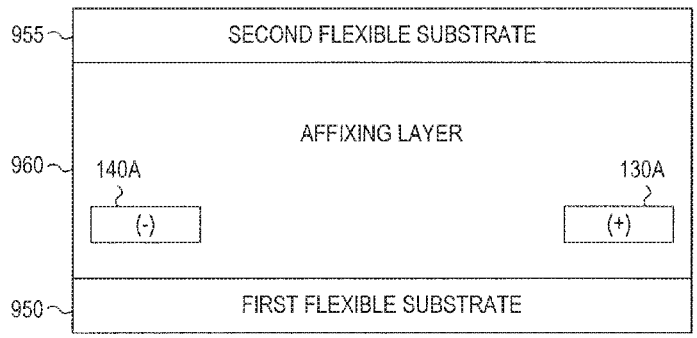
FIG. 10C is a side cross-sectional view of the portion of a lighting device of FIG. 8 along the line XC-XC' according to a disclosed embodiment.

FIG. 10C is a side cross-sectional view of the portion of a lighting device 800 of FIG. 8 along the line XC-XC' according to a disclosed embodiment. This cross-sectional view shows a point between lighting elements 120. As shown in FIG. 10C, the portion of a lighting device 800 includes a first transparent substrate 950, semi-transparent positive and negative conductive elements 130A, 140A, a second transparent substrate 955, and an affixing layer 960.

FIG. 10C is similar to FIG. 9C, save that the light-emitting element 410 and its connectors, as well as the first and second transparent conducting layers 830, 840 are not present. However, because the semi-transparent positive and negative conductive elements 130A, 140A extend the length of the flexible ribbon 110, they are present between lighting elements 120. Although there is a gap shown between the semi-transparent positive and negative conductive elements 130A, 140A and the first flexible substrate 950, the semi-transparent positive and negative conductive elements 130A, 140A are supported by the plurality of first and second transparent conducting layers 830, 840, as well as the affixing layer 960.

If the lighting device 100 must remain flexible, the positive and negative conductive elements 130A, 140A should also be configured such that they can bend without breaking or losing their ability to carry a current.

The light-emitting element 410 is configured to generate light based on the control current carried on the semi-transparent positive and negative conductive elements 130A, 140A. One exemplary light-emitting element 410 used in the disclosed embodiments is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode.

In alternate embodiments, a phosphor layer may be deposited above the light-emitting element 410. This may be a separate layer, or combined with the second transparent substrate. A phosphor layer operates to scatter light emitted from the top surface of the light-emitting element 410. When the light emitted by the light-emitting element 410 is within the wavelength spectrum between ultraviolet and blue light (i.e., from about 10 nm to 490 nm), a phosphor layer scatters the emitted light such that it becomes white light. In this way, when the light-emitting elements 410 is a light-emitting diode (LED) that emits light of a single wavelength, the resulting lighting element 120 can generate white light. For this reason, many manufacturers of LEDs will manufacture blue- or ultraviolet-emitting diodes that include a phosphor layer already applied to the light-emitting surface of the LED.

In addition, other alternate embodiments can include a lens deposited over the light-emitting element 410. Such a lens could be provided for a variety of purposes. It could operate to focus the light emitted from the light-emitting element 410 in order to increase light output by allowing light to be emitted perpendicular to the surface of the second transparent substrate 955; it could act to diffuse light emitted from the light-emitting element 410 to allow light to be emitted at a larger angle of incidence from the light-emitting element 410; or it could be a colored lens that acts to color the light emitted from the light-emitting element 410.

Furthermore, alternate embodiments can include one or both of a heat sink and a heat spreading layer attached to the bottom of the first flexible substrate 950 (i.e., the side opposite the side on which the remainder of elements are located). A heat sink operates to dissipate heat from the lighting elements 120, while a heat spreader operates to spread the heat such that it is not focused on the point just underneath the lighting elements 120. A heat sink can be a flexible metal layer (e.g., a metal tape), a flexible ceramic thin-film layer, or any flexible material that dissipates heat sufficiently. A heat spreader can be a flexible metal layer (e.g., a metal tape), a flexible ceramic thin-film layer, or any flexible material that spreads heat sufficiently.

In addition, although the embodiments disclosed above use a second transparent substrate 955, the second transparent substrate can be replaced in alternate embodiments with a transparent conformal coat that is deposited over the light emitting element 410 and then hardened.

Flexible Lighting Device Using Thin Wire Conductive Element

FIG. 11 is an overhead view of a portion of a lighting device 1100 having a thin wire conductive element according to a disclosed embodiment. As shown in FIG. 11, the portion of a lighting device 1100 includes a plurality of lighting elements 120, a thin wire positive conductive element 130B, and a thin wire negative conductive element 140B.

In this embodiment, the plurality of lighting elements 120 are applied directly above at least a portion of each of the thin wire positive conductive elements 130B and the thin wire negative conductive element 140B. As a result, a first contact element (not shown in FIG. 11) can connect directly to the thin wire positive conductive element 130B (i.e., it can connect directly via a first conductive connector, also not shown in FIG. 11). Similarly, a second contact element (not shown in FIG. 11) can connect directly to the thin wire negative conductive element 140B (i.e., it can connect directly via a second conductive connector, also not shown in FIG. 11).

FIG. 12 is an overhead view of a portion of a lighting device 1200 having thin wire conductive elements according to another disclosed embodiment. As shown in FIG. 12, the portion of the lighting device 1200 includes a plurality of lighting elements 120, a first connecting layer 730, a second connecting layer 740, a thin wire positive conductive element 130B, and a thin wire negative conductive element 140B.

In this embodiment, the plurality of lighting elements 120 are not applied directly over the thin wire positive and negative conductive elements 130B, 140B. As a result, this embodiment requires a first connecting layer 730 to connect first contact elements (not shown in FIG. 12) to the thin wire positive conductive element 130B, and a second connecting layer 740 to connect second contact elements (not shown in FIG. 12) to the thin wire negative conductive element 140B.

FIG. 13 is an overhead view of a portion of a lighting device 1300 having thin wire conductive elements according to yet another disclosed embodiment. As shown in FIG. 13, the portion of the lighting device 1300 includes a plurality of lighting elements 120, a plurality of first connecting layers 830, a plurality of second connecting layers 840, a thin wire positive conductive element 130B, and a thin wire negative conductive element 140B.

As with the embodiment of FIG. 12, the plurality of lighting elements 120 in this embodiment are not applied directly over the thin wire positive and negative conductive elements 130B, 140B. As a result, the plurality of first connecting layers 830 are provided to connect first contact elements (not shown in FIG. 13) to the thin wire positive conductive element 130B, and the plurality of second connecting layers 840 are provided to connect second contact elements (not shown in FIG. 13) to the thin wire negative conductive element 140B.

In each of FIGS. 11-13, a thin wire is used for the positive and negative conductive elements 130B, 140B. Although not transparent, the use of thin wires can obscure the positive and negative conductive elements 130B, 140B from the naked eye, making them difficult to see, particularly from a distance.

As with the designs of FIGS. 6-8, it should be understood that although the designs in FIGS. 11-13 are all shown as being symmetrical, this is not required. In other words, in alternate embodiments the plurality of lighting elements 120 could be applied directly over one of the thin wire conductive elements 130B, 140B, but require a connecting layer to connect to the other thin wire conductive element 130B, 140B. Likewise, the displacement of the thin wire conductive elements 130 B, 140 B with respect to the lighting elements 120 may vary.

Figure 14A:
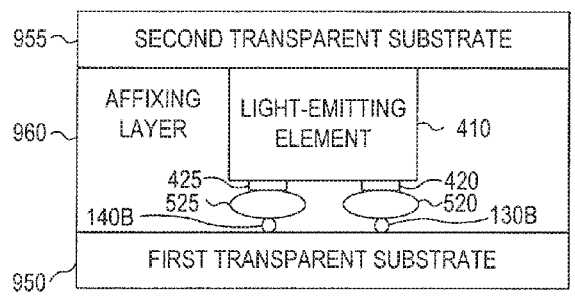
FIG. 14A is a side cross-sectional view of the portion of a lighting device of FIG. 11 along the line XIVA-XIVA' according to a disclosed embodiment.

FIG. 14A is a side cross-sectional view of the portion of a lighting device 1100 of FIG. 11 along the line XIVA-XIVA' according to a disclosed embodiment. As shown in FIG. 14A, the portion of a lighting device 1100 includes a first transparent substrate 950, thin wire positive and negative conductive elements 130B, 140B, a light-emitting element 410, first and second contact elements 420, 425, first and second conductive connectors 520, 525, a second transparent substrate 955, and an affixing layer 960.

The first transparent substrate 950 serves as a base for the remainder of the lighting device 1100. As a reference direction, the first flexible substrate 950 can be considered to be a "bottom" substrate upon which the other elements are stacked. However, this is as a point of reference only. The lighting device 1100 has no inherent direction, and can be oriented in any manner, even with the first transparent substrate 950 being on the "top" of the structure.

The thin wire positive and negative conductive elements 130B, 140B are located on top of the first transparent substrate 950. Each is made of a thin wire conductive material that is connected to the control circuit 150, and is configured to carry a control current generated by the control circuit 150 throughout the lighting device 1100.

Figure 14B:
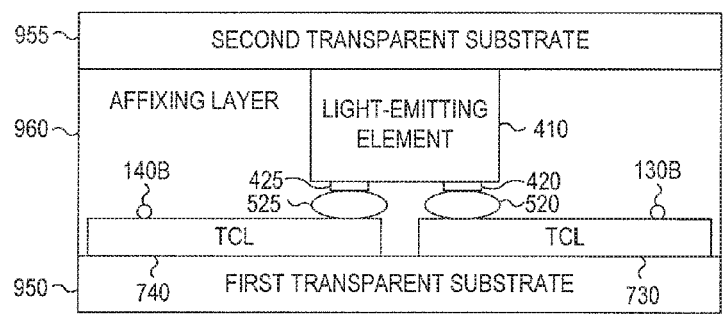
FIG. 14B is a side cross-sectional view of the portion of a lighting device of FIG. 12 along the line XIVB-XIVB' according to a disclosed embodiment.

FIG. 14B is a side cross-sectional view of the portion of a lighting device 1200 of FIG. 12 along the line XIVB-XIVB' according to a disclosed embodiment. As shown in FIG. 14B, the portion of a lighting device 1200 includes a first transparent substrate 950, first and second transparent connecting layers 730, 740, thin wire positive and negative conductive elements 130B, 140B, a light-emitting element 410, first and second contact elements 420, 425, first and second conductive connectors 520, 525, a second transparent substrate 955, and an affixing layer 960.

The first and second transparent connecting layers 730, 740 are formed over the first transparent substrate 950, and the thin wire positive and negative conductive elements 130B, 140B are formed over the first and second transparent connecting layer 730, 740, respectively. The light-emitting element 410 is formed over the first and second transparent connecting layers 730, 740 such that a first contact element 420 connects to the first transparent connecting layer 730 through the first conductive connector 520, and such that a second contact element 425 connects to the second transparent connecting layer 740 through the second conductive connector 525.

Figure 14C:
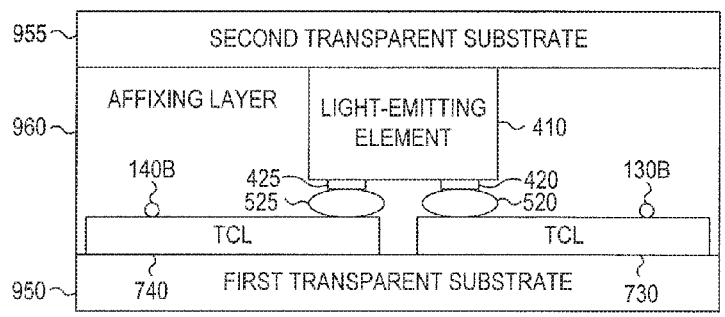
FIG. 14C is a side cross-sectional view of the portion of a lighting device of FIG. 13 along the line XIVC-XIVC' according to a disclosed embodiment.

FIG. 14C is a side cross-sectional view of the portion of a lighting device 1300 of FIG. 13 along the line XIVC-XIVC' according to a disclosed embodiment. As shown in FIG. 14C, the portion of a lighting device 1300 includes a first transparent substrate 950, first and second transparent connecting layers 830, 840, thin wire positive and negative conductive elements 130B, 140B, a light-emitting element 410, first and second contact elements 420, 425, first and second conductive connectors 520, 525, a second transparent substrate 955, and an affixing layer 960.

FIG. 14C is similar to FIG. 14B, except that the transparent conducting layers 830, 840 represent an individual conducting layer for the light-emitting element 410.

Figure 15A:
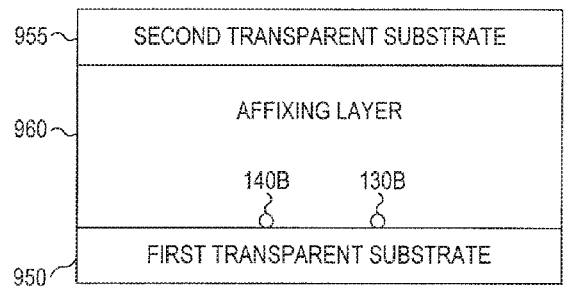
FIG. 15A is a side cross-sectional view of the portion of a lighting device of FIG. 11 along the line XVA-XVA' according to a disclosed embodiment.

FIG. 15A is a side cross-sectional view of the portion of a lighting device 1100 of FIG. 11 along the line XVA-XVA' according to a disclosed embodiment. This cross-sectional view shows a point between lighting elements 120. As shown in FIG. 15A, the portion of a lighting device 1100 includes a first transparent substrate 950, thin wire positive and negative conductive elements 130B, 140B, a second transparent substrate 955, and an affixing layer 960.

FIG. 15A is similar to FIG. 14A, save that the light-emitting element 410 and its connectors are not present. However, because the thin wire positive and negative conductive elements 130B, 140B extend the length of the flexible ribbon 110, they are present between lighting elements 120.

Figure 15B:
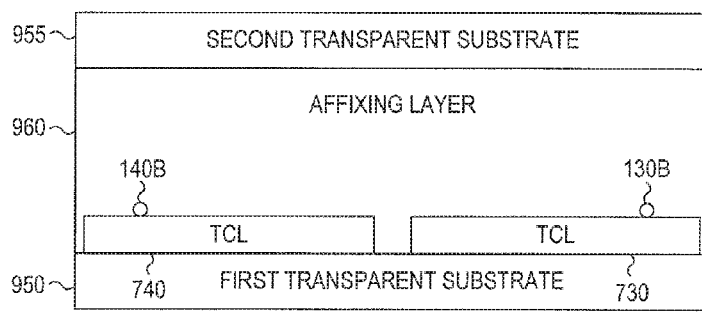
FIG. 15B is a side cross-sectional view of the portion of a lighting device of FIG. 12 along the line XVB-XVB' according to a disclosed embodiment.

FIG. 15B is a side cross-sectional view of the portion of a lighting device 1200 of FIG. 12 along the line XVB-XVB' according to a disclosed embodiment. This cross-sectional view shows a point between lighting elements 120. As shown in FIG. 15B, the portion of a lighting device 1200 includes a first transparent substrate 950, thin wire positive and negative conductive elements 130B, 140B, first and second transparent conducting layers 730, 740, a second transparent substrate 955, and an affixing layer 960.

FIG. 15B is similar to FIG. 14B, save that the light-emitting element 410 and its connectors are not present. However, because the thin wire positive and negative conductive elements 130B, 140B and the first and second transparent conducting layers 730, 740 extend the length of the flexible ribbon 110, they are present between lighting elements 120.

Figure 15C:
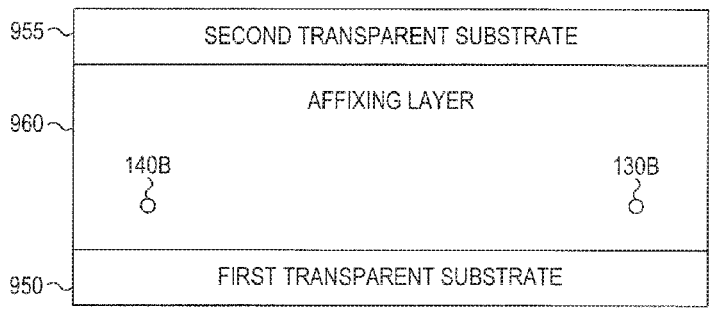
FIG. 15C is a side cross-sectional view of the portion of a lighting device of FIG. 13 along the line XVC-XVC' according to a disclosed embodiment.

FIG. 15C is a side cross-sectional view of the portion of a lighting device 1300 of FIG. 13 along the line XVC-XVC' according to a disclosed embodiment. This cross-sectional view shows a point between lighting elements 120. As shown in FIG. 15C, the portion of a lighting device 1300 includes a first transparent substrate 950, thin wire positive and negative conductive elements 130B, 140B, first and second transparent conducting layers 730, 740, a second transparent substrate 955, and an affixing layer 960.

FIG. 15C is similar to FIG. 14C, save that the light-emitting element 410 and its connectors, as well as the first and second transparent conducting layers 830, 840 are not present. However, because the thin wire positive and negative conductive elements 130B, 140B extend the length of the flexible ribbon 110, they are present between lighting elements 120. Although there is a gap shown between the thin wire positive and negative conductive elements 130B, 140B and the first flexible substrate 950, the thin wire positive and negative conductive elements 130B, 140B are supported by the plurality of first and second transparent conducting layers 830, 840, as well as the affixing layer 960.

In the embodiments disclosed in FIGS. 11-15C, the thin wire positive and negative conductive elements 130B, 140B are conductive wires that are 300 µm or smaller in width, used to conduct electricity throughout the flexible lighting device 100. These thin wire conductive elements can be made of copper, aluminum, silver, alloys of copper, aluminum, or silver, and nano-composites containing copper, aluminum, or silver, or any suitable conductive material.

If the lighting device 100 must remain flexible, the first and second conductive elements 130, 140 should also be configured such that they can bend without breaking or losing their ability to carry a current.

The light-emitting element 410 is configured to generate light based on the control current carried on the thin wire first and second conductive elements 130B, 140B. One exemplary light-emitting element 410 used in the disclosed embodiments is a light-emitting diode (LED). An LED has an anode (i.e., a positive side) and a cathode (i.e., a negative side), and operates to generate light of a specific wavelength (from infrared to ultraviolet, i.e., having a wavelength from 10 nm to 100,000 nm) when current flows through the LED from the anode to the cathode.

As with the embodiments disclosed above using a semi-transparent conductive element 130A, 140A, embodiments using a thin wire conductive element 130B, 140B can deposit a phosphor layer above the light emitting element 410, can deposit a lens above the light emitting element 410, can include one or both of a heat sink and a heat spreading layer attached to the bottom of the first transparent substrate 950, and can replace the second transparent substrate 955 with a transparent conformal coat.

Flexible Lighting Device—Concealed Buss Bar

Figure 16:
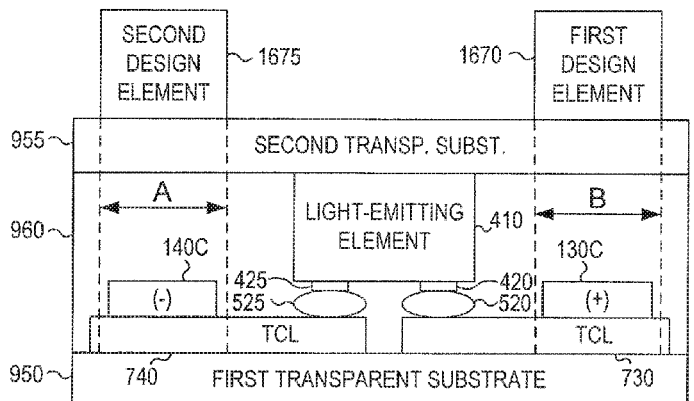
FIG. 16 is a side cross-sectional view of the flexible lighting device of FIG. 7 along the line XIVB-XIVB' where the conductive elements are obscured by design features according to yet another disclosed embodiment.

FIG. 16 is a side cross-sectional view of the flexible lighting device 1600 similar to that of FIG. 7 along the line IXB-IXB', in which the conductive elements are concealed by design features according to yet another disclosed embodiment. As shown in FIG. 16, the portion of a lighting device 1600 includes a first transparent substrate 950, positive and negative conductive elements 130C, 140C, a light-emitting element 410, first and second contact elements 420, 425, first and second conductive connectors 520, 525, a second transparent substrate 955, an affixing layer 960, and first and second design elements 1670, 1675.

The first transparent substrate 950 serves as a base for the remainder of the lighting device 1600. As a reference direction, the first flexible substrate 950 can be considered to be a "bottom" substrate upon which the other elements are stacked. However, this is as a point of reference only. The lighting device 1600 has no inherent direction, and can be oriented in any manner, even with the first transparent substrate 950 being on the "top" of the structure.

The positive and negative conductive elements 130C, 140C are located on top of the first transparent substrate 950. Each is made of a conductive material that is connected to the control circuit 150, and is configured to carry a control current generated by the control circuit 150 throughout the lighting device 1600. In various embodiments, the positive and negative conductive elements 130C, 140C can be made of metal layers such as silver, aluminum or copper. There is no requirement in this embodiment for the positive and negative conductive elements 130C, 140C to either be made of a semi-transparent material or to be made of a thin wire, since the positive and negative conductive elements 130C, 140C will be obscured by the first and second design elements 1670, 1675.

The first design element 1670 is formed over exposed portions of the positive conductive element 130C, and serves to partly or completely conceal the positive conductive element 130C from view in a selected viewing direction. It has a width B that is at least as wide as the width of the exposed portions of the positive conductive element 130C, and a length at least as long as the length of the exposed portions of the positive conductive element 130C. Similarly, the second design element 1675 is applied over exposed portions of the negative conductive element 140C, and serves to part or completely conceal the negative conductive element 140C from view in the selected viewing direction. It has a width A that is at least as wide as the width of the exposed portions of the negative conductive element 140C, and a length at least as long as the length of the exposed portions of the negative conductive element 140C.

In various embodiments, the first and second design elements 1670, 1675 can be any decorative or functional feature that can serve to obscure the positive and negative conductive elements 130C, 140C. For example, they could be a frame for the lighting device 100, decorative stripes running the length of the lighting device, optical patterns created by films, frames of supporting structures, etc.

As with the embodiments disclosed above using semi-transparent conductive elements 130A, 140A, or thin wire conductive elements 130B, 140B, alternate embodiments using an obscured conductive element 130C, 140C can deposit a phosphor layer above the light emitting element 410, can deposit a lens above the light emitting element 410, can include one or both of a heat sink and a heat spreading layer attached to the bottom of the first transparent substrate 950, and can replace the second transparent substrate 955 with a transparent conformal coat.

Although FIG. 16 shows an embodiment in which the obscured positive and negative conductive elements 130C, 140C are set away from the light-emitting element 410, alternate embodiments can alter the position of either or both of the obscured positive and negative conductive elements 130C, 140C (e.g., as seen in FIGS. 6, 9A, and 10A). In some embodiments, a portion of the positive and negative conductive elements 130C, 140C may be obscured by the light-emitting elements 410. In such a case, there is no need for a design element 1670, 1675 to obscure those portions of the positive and negative conductive elements 130C, 140C. In fact, the design elements 1670, 1675 should avoid covering the light-emitting elements 410, to avoid interfering with the light emitted from these elements.

Method of Manufacturing a Flexible Lighting Device

Figure 17A:
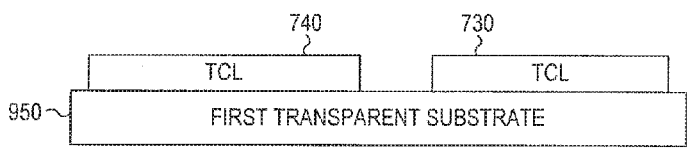
FIGS. 17A-17C are side cross-sectional views illustrating a manufacturing process of the flexible lighting device of FIGS. 7 and 8 according to disclosed embodiments.
Figure 17B:
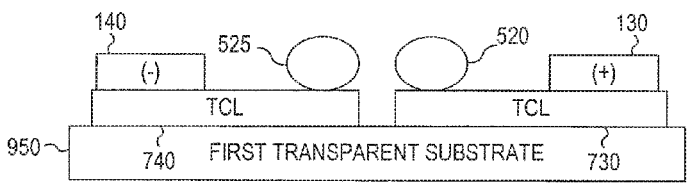
Figure 17C:
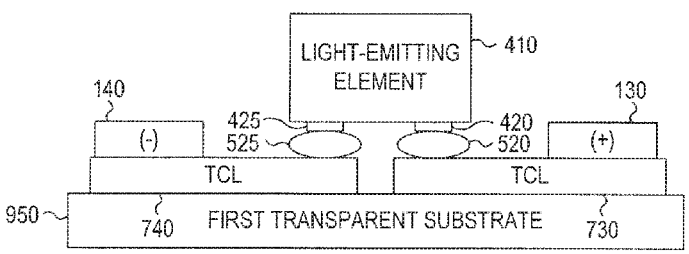

FIGS. 17A-17C are side cross-sectional views illustrating a manufacturing process of the flexible lighting device 700 of FIG. 7 according to disclosed embodiments. FIG. 18 is a flow chart showing a manufacturing process 1800 of a flexible lighting device according to disclosed embodiments.

As shown in FIGS. 17A and 18, the manufacturing process 1800 begins by providing a first transparent substrate 950 (1810).

As shown in FIGS. 17A, 17B, and 18, a first electrical connecting structure is then applied over the first transparent substrate (1820), and a second electrical connecting structure is then applied over the first transparent substrate (1830).

In the embodiment shown in FIGS. 17A-17C, the first electrical connecting structure includes a first transparent conducting layer 730 applied over the first transparent substrate 950, and a positive conductive element 130 applied over the first transparent conducting layer 730. Similarly, in this embodiment, the second electrical connecting structure includes a second transparent conducting layer 740 applied over the first transparent substrate 950, and a negative conductive element 140 applied over the second transparent conducting layer 740. However, alternate embodiments can employ different first and second electrical connecting structures. For example, in some embodiments the first and second electrical connecting structures can be formed from only the positive and negative conductive elements 130, 140, respectively.

As shown in FIGS. 17C and 18, the manufacturing process 1800 continues as the lighting element 120 is applied over the first and second electrical connecting structures, such that it is electrically connected to both the first and the second electrical connecting structures (1840).

In the embodiment disclosed in FIG. 17C, a light-emitting element 410 is brought into contact with the first and second connecting conductors 520, 525, which then contact the first and second transparent conducting layers 730, 740, respectively. In particular, the first and second connecting elements 420, 425 on the light-emitting element 410 come into contact with the first and second conducting connectors 520, 525, respectively. Typically this operation involves a baking step after the light-emitting element 410 is applied, to dry the connection (i.e., the first and second conducting connectors 520, 525.)

In this way the light-emitting element 410 is attached to the first and second electrical connecting structures, which can provide control signals to the light-emitting element 410. In the embodiment disclosed in FIG. 17C, a first connecting element 420 of the light-emitting element 410 is connected to the first electrical connecting structure, which serves as a positive control line. Likewise, a second connecting element 425 of the light-emitting element 410 is connected to the second electrical connecting structure, which serves as a negative control line.

As shown in FIGS. 9B and 18, the manufacturing process 1800 continues as a transparent affixing material 960 is formed over the entire structure (1850).

As shown in FIGS. 9B and 18, the manufacturing process 1800 continues as a second transparent substrate 955 is applied over the entire structure (1860). In such an operation, the first and second transparent substrates 950, 955 are pressed together to fix them to each other via the transparent affixing material 960. During this process, the transparent affixing material 960 will flow around the light-emitting elements 410 and the first and second electrical connecting structures such that it does not disturb these elements, but also affixes them in place. In the embodiments disclosed in FIGS. 9A-16, little to none of the transparent affixing material 960 remains between the light-emitting elements 410 and the second transparent substrate 955. However, in alternate embodiments, some portion of the transparent affixing material 960 may remain between the light-emitting elements 410 and the second transparent substrate 955.

In one particular embodiment, the transparent affixing material 960 can be initially affixed to one side of the second transparent substrate 955, and then the two pressed down on the rest of the structure. This is by way of example only. In alternate embodiments, the transparent affixing material 960 could initially be applied first to the first transparent substrate 950, the first and second electrical connecting structures, and the light-emitting elements 410. Alternatively, both the first and second transparent substrates 950, 955 can be combined with the transparent affixing material 960 simultaneously.

FIGS. 19A and 19B are flow charts showing a process of forming a first/second electrical connecting structure over a first transparent substrate from FIG. 18 according to disclosed embodiments.

As shown in FIG. 19A, the process of forming a first/second electrical connecting structure (1820, 1830) may be as simple as forming a conductive element 130, 140 over the transparent substrate 950 (1910).

In this case, the electrical connecting structure is formed from the conductive element 130, 140 alone. In particular, the first electrical connecting structure is formed from the positive conductive element 130, while the second electrical connecting structure is formed from the negative conductive element 140. An exemplary resultant structure can be seen in FIGS. 6 and 9A.

As shown in FIG. 19B, the process of forming a first/second electrical connecting structure (1820, 1830) may also include forming a transparent conducting layer 730, 740 over the first transparent substrate 950 (1920) and forming a conductive element 130, 140 over the transparent conducting layer 730, 740 (1930).

In this case, the electrical connecting structure is formed from the transparent conducting layer 730, 740 and the conductive element 130, 140. In particular, the first electrical connecting structure is formed from the first transparent conducting layer 730 and the positive conductive element 130, while the second electrical connecting structure is formed from the second transparent conducting layer 730 and the negative conductive element 140. Exemplary resultant structures can be seen in FIGS. 7, 8, 9B, and 9C.

FIG. 20 is a flow chart showing a process of forming a light element over first and second connecting structures (1840) from FIG. 18 according to a disclosed embodiment.

As shown in FIG. 20, this process can include applying a first conductive material 520 on a first electrical conducting structure (2010), applying a second conductive material 525 on a second electrical connecting structure (2020), and placing a light-emitting element 410 on the first and second conductive materials 520, 525 such that a first electrode on the light-emitting element connects to the first conductive material 520, and a second electrode on the light-emitting element connects to the second conductive material 525 (2030).

As shown above, the first and second electrical conducting structures can be varied in form, but may include simply a conductive element 130, 140, or may include a transparent conducting layer 730, 740, with a corresponding conductive element 130, 140 placed on top of the conducting layer 730, 740.

The first and second conductive materials may be formed from: silver epoxy dots, a conductive adhesive, metal pads, or any other suitable conductive material.

Although the drawings with respect to the above manufacturing process show the conductive elements 130, 140 as being conductive layers, such as a semi-transparent or opaque buss bar (130A, 140A, or 130C, 140C), the described process is equally applicable to embodiments in which the conductive elements 130, 140 are conductive thin wires (130B, 140B).

Although FIGS. 17B, 18, 19A, and 19B disclose that the positive and negative conductive elements 130, 140 are deposited in separate steps, in some embodiments they can be formed onto the first transparent substrate 950 or the first and second transparent conducting layers 730, 740 at the same time.

Although FIGS. 17B, 18, and 20 disclose that the first and second conductive connectors 520, 525 are applied in separate steps, in some embodiments they can be applied onto the positive and negative conductive elements 130, 140 at the same time.

Furthermore, although FIGS. 17A-20 disclose layers applied only on top of the first transparent substrate 950, in alternate embodiments one or both of a heat spreader or a heat sink may be attached to a bottom of the first transparent substrate 950.

In addition, in alternate embodiments a phosphor layer and/or a lens can be deposited above the light-emitting element 410. The second transparent substrate 955 may also be replaced with a transparent conformal coat, which is deposited in a viscous state and later hardened.

Individually-Controlled Light-Emitting Elements

FIG. 21 is an overhead view of a portion of a lighting device 2100 in which individual lighting elements 120 can be selectively activated according to yet another disclosed embodiment. As shown in FIG. 21, the lighting device 2100 includes a plurality of lighting elements 120A-120F, a plurality of first transparent conductive layers 2130A-2130F, and a plurality of second transparent conductive layers 2140A-2140F.

The plurality of lighting elements 120A-120F can be any suitable light-emitting element 410, including the first and second connection electrodes (not shown in FIG. 21) located on the same side of the light-emitting element 410.

The plurality of positive transparent conductive layers 2130A-2130F are isolated from each other, and are configured to connect to the first connection electrodes in each of the plurality of lighting elements 120A-120F, respectively.

The plurality of negative transparent conductive layers 2140A-2140F are isolated from each other, and are configured to connect to the second connection electrodes in each of the plurality of lighting elements 120A-120F, respectively.

In this way, signals sent along corresponding pairs of positive and negative transparent conductive layers (2130A and 2140A, 2130B and 2140B, etc.) can be used to individually control each of the plurality of lighting elements 120A-120F.

FIG. 22A is a side cross-sectional view of the flexible lighting device of FIG. 21 along the line XVIIA-XVIIA' according to a disclosed embodiment. This cross-sectional view is at a first lighting element 120A.

As shown in FIG. 22A, a first positive transparent conductive layer 2130A and a first negative transparent conductive layer 2140A are formed over a first transparent substrate 950. A first conductive connector 520A is formed over the first positive transparent conductive layer 2130A, while a second conductive connector 525A is formed over the first negative transparent conductive layer 2140A.

A first light-emitting element 410A is placed on the first and second conductive connectors 520A, 525A such that a first connecting electrode 420A of the first light-emitting element 410A is connected to the first conductive connector 520A, and a second connecting electrode 425A of the first light-emitting element 410A is connected to the second conductive connector 525A. In this way the first connecting electrode 420A is electrically connected to the first positive transparent conductive layer 2130A, and the second connecting electrode 425A is electrically connected to the first negative transparent conductive layer 2140A.

Because this is the first light-emitting element 410A, the first positive and negative transparent conductive layers 2130A, 2140A extend to a width sufficient to allow room for all subsequent transparent conductive layers (i.e., positive transparent conductive layers 2130B-2130F and negative transparent conductive layers 2140B-2140F) to be formed in a manner such that each are isolated from the first positive and negative transparent conductive layers 2140A, 2140A, and from one another.

FIG. 22B is a side cross-sectional view of the flexible lighting device of FIG. 21 along the line XVIIB-XVIIB' according to a disclosed embodiment. This cross-sectional view is at a third lighting element 120C.

As shown in FIG. 22B, a third positive transparent conductive layer 2130C and a third negative transparent conductive layer 2140C are applied over a first transparent substrate 950. A first conductive connector 520C is applied over the third positive transparent conductive layer 2130C, while a second conductive connector 525C is applied over the third negative transparent conductive layer 2140C. In addition, first and second positive transparent conductive layers 2130A, 2130B run alongside the third positive transparent conductive layer 2130C in such a way as to be isolated from the third positive transparent conductive layer 2130C and from each other. Likewise, first and second negative transparent conductive layers 2140A, 2140B run alongside the third negative transparent conductive layer 2140C in such a way as to be isolated from the third negative transparent conductive layer 2140C and from each other.

A third light-emitting element 410C is placed on the first and second conductive connectors 520C, 525C such that a first connecting electrode 420C of the third light-emitting element 410C is connected to the first conductive connector 520C, and a second connecting electrode 425C of the third light-emitting element 410C is connected to the second conductive connector 525C. In this way the first connecting electrode 420C is electrically connected to the third positive transparent conductive layer 2130C, and the second connecting electrode 425C is electrically connected to the third negative transparent conductive layer 2140C.

Because this is the third light-emitting element 410C, the third positive and negative transparent conductive layers 2130C, 2140C extend to a width sufficient to allow room for all subsequent transparent conductive layers (i.e., positive transparent conductive layers 2130D-2130F and negative transparent conductive layers 2140D-2140F) to be formed in a manner such that each are isolated from the third positive and negative transparent conductive layers 2130D, 2140D, and from one another.

FIG. 22C is a side cross-sectional view of the flexible lighting device of FIG. 21 along the line XVIIC-XVIIC' according to a disclosed embodiment. This cross-sectional view is at a sixth lighting element 120F.

As shown in FIG. 22C, a sixth positive transparent conductive layer 2130F and a sixth negative transparent conductive layer 2140F are applied over a first transparent substrate 950. A first conductive connector 520F is applied over the sixth positive transparent conductive layer 2130F, while a second conductive connector 525F is applied over the sixth negative transparent conductive layer 2140F. In addition, first through fifth positive transparent conductive layers 2130A-2130E run alongside the sixth positive transparent conductive layer 2130F in such a way as to be isolated from the sixth positive transparent conductive layer 2130F and from each other. Likewise, first through fifth negative transparent conductive layers 2140A-2140E run alongside the sixth negative transparent conductive layer 2140F in such a way as to be isolated from the sixth negative transparent conductive layer 2140F and from each other.

A sixth light-emitting element 410F is placed on the first and second conductive connectors 520F, 525F such that a first connecting electrode 420F of the sixth light-emitting element 410F is connected to the first conductive connector 520F, and a second connecting electrode 425F of the sixth light-emitting element 410F is connected to the second conductive connector 525F. In this way the first connecting electrode 420F is electrically connected to the sixth positive transparent conductive layer 2130F, and the second connecting electrode 425F is electrically connected to the sixth negative transparent conductive layer 2140F.

Because this is the sixth (and last) light-emitting element 410F, the sixth positive and negative transparent conductive layers 2130F, 2140F do not need to extend beyond a minimum amount required to provide a width sufficient to allow the sixth positive and negative transparent conductive layers 2130F, 2140F to clear the sixth light-emitting element 410.

In the embodiment disclosed in FIGS. 22-23C, the positive and negative transparent conductive layers 2130A-2130F, 2140A-2140F may be made of a material such as metals, transparent conductive inks, or transparent conductive polymers.

In these embodiments, the light-emitting elements 410 are configured to generate light based on the control currents carried on the relevant pair of positive and negative transparent conducting layers 2130, 2140. One exemplary light-emitting element 410 used in the disclosed embodiments is a light-emitting diode (LED). An LED has an anode (i.e., a positive side) and a cathode (i.e., a negative side), and operates to generate light of a specific wavelength (from ultraviolet to infrared, i.e., having a wavelength from 10 nm to 100,000 nm) when current flows through the LED from the anode to the cathode.

As with the embodiments disclosed above using a semi-transparent conductive element 130A, 140A, embodiments using a plurality of positive and negative transparent conducting layers 2130, 2140, can deposit a phosphor layer above the light emitting element 410, can deposit a lens above the light emitting element 410, can include one or both of a heat sink and a heat spreading layer attached to the bottom of the first transparent substrate 950, and can replace the second transparent substrate 955 with a transparent conformal coat.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method of forming a lighting element, comprising:
forming a first substrate;
applying a first conductive element over the first substrate;
forming a first transparent conductive layer at least partially adjacent to the first conductive element,
applying a second conductive element over the first substrate;
installing a light-emitting element over the first substrate such that a first contact of the light-emitting element is electrically connected to the first conductive element and such that a second contact of the light-emitting element is electrically connected to the second conductive element, the first and second contacts both being on a first surface of the light-emitting element;
forming an affixing layer over the first substrate; and
forming a transparent layer over the light-emitting element and the affixing layer such that the affixing layer affixes the transparent layer to the first substrate,
wherein
the light-emitting element is configured to emit light having a first narrow range of wavelengths between 10 nm and 100,000 nm from the second surface,
in the operation of installing the light-emitting element, the first contact is formed to be at least partially adjacent to the first transparent conductive layer,
the first transparent conductive layer is configured to electrically connect the first contact and the first conductive element,
the first and second conductive elements are both at least partially transparent to visible light, and
the transparent layer, the affixing layer, and first transparent conductive layer are all sufficiently transparent to visible light such that they will not decrease light transmittance below 70%.

2. The method of claim 1, wherein
the light-emitting element is installed to at least partially overlap the first conductive element.

3. The method of claim 1, further comprising:
forming a second transparent conductive layer at least partially adjacent to the second contact,
wherein
in the operation of installing the light-emitting element, the second contact is formed to be at least partially adjacent to the second transparent conductive layer,
the second transparent conductive layer is configured to electrically connect the second contact and the second conductive element, and
the second transparent conductive layer is sufficiently transparent to visible light such that it will not decrease light transmittance below 70%.

4. The method of claim 3, wherein
the light-emitting element is installed to at least partially overlap both the first and the second conductive elements.

5. The method of claim 3, wherein
the light-emitting element is installed such that it does not overlap either of the first and second conductive elements.

* * * * *